US010338446B2

(12) United States Patent
Matsukizono

(10) Patent No.: US 10,338,446 B2
(45) Date of Patent: Jul. 2, 2019

(54) SEMICONDUCTOR DEVICE HAVING LOW RESISTANCE SOURCE AND DRAIN REGIONS

(71) Applicant: Sharp Kabushiki Kaisha, Sakai, Osaka (JP)

(72) Inventor: Hiroshi Matsukizono, Sakai (JP)

(73) Assignee: SHARP KABUSHIKI KAISHA, Sakai, Osaka (JP)

( * ) Notice: Subject to any disclaimer, the term of this patent is extended or adjusted under 35 U.S.C. 154(b) by 52 days.

(21) Appl. No.: 15/535,684

(22) PCT Filed: Dec. 9, 2015

(86) PCT No.: PCT/JP2015/084483
§ 371 (c)(1),
(2) Date: Jun. 13, 2017

(87) PCT Pub. No.: WO2016/098651
PCT Pub. Date: Jun. 23, 2016

(65) Prior Publication Data
US 2017/0363893 A1    Dec. 21, 2017

Related U.S. Application Data

(63) Continuation of application No. PCT/JP2015/084483, filed on Dec. 9, 2015.

(30) Foreign Application Priority Data

Dec. 16, 2014 (JP) .................................. 2014-253914

(51) Int. Cl.
*H01L 29/08* (2006.01)
*H01L 29/41* (2006.01)
(Continued)

(52) U.S. Cl.
CPC ...... *G02F 1/1368* (2013.01); *G02F 1/136213* (2013.01); *H01L 21/385* (2013.01);
(Continued)

(58) Field of Classification Search
CPC ............. H01L 29/0847; H01L 29/0865; H01L 29/0869; H01L 29/41733; H01L 29/4908;
(Continued)

(56) References Cited

U.S. PATENT DOCUMENTS 6,130,119 A * 10/2000 Jinnai ................. H01L 21/3185
257/59
6,225,668 B1 * 5/2001 Shindo ................. B81C 1/0038
257/296
(Continued)

FOREIGN PATENT DOCUMENTS

JP       03083346 A  *  4/1991
JP    2007206698 A      8/2007
(Continued)

*Primary Examiner* — Ida M Soward
(74) *Attorney, Agent, or Firm* — ScienBiziP, P.C.

(57) ABSTRACT

A semiconductor device has a top-gate structure resistant to creation of parasitic capacitance between a low-resistance region formed in a semiconductor layer and a gate electrode. A TFT (100) has a low-resistance region, a portion of which has a first length (L1) ranging from a first position (P1) corresponding to an end of a gate insulating film to a region below a gate electrode (40), and the first length is substantially equal to a second length (L2) ranging from the first position (P1) to a second position (P2) corresponding to an end of the gate electrode (40). Thus, the overlap between the gate electrode (40) and either a source region (20 *s*) or a drain region (20 *d*) can be reduced, resulting in diminished parasitic capacitance.

2 Claims, 13 Drawing Sheets

(51) Int. Cl.
*H01L 29/49* (2006.01)
*H01L 51/52* (2006.01)
*H01L 21/82* (2006.01)
*G02F 1/1368* (2006.01)
*H01L 21/8234* (2006.01)
*H01L 27/06* (2006.01)
*H01L 27/08* (2006.01)
*H01L 29/786* (2006.01)
*G02F 1/1362* (2006.01)
*H01L 21/385* (2006.01)
*H01L 21/44* (2006.01)
*H01L 29/417* (2006.01)
*H01L 21/8238* (2006.01)
*H01L 27/12* (2006.01)

(52) U.S. Cl.
CPC .......... *H01L 21/44* (2013.01); *H01L 21/8234* (2013.01); *H01L 27/06* (2013.01); *H01L 27/08* (2013.01); *H01L 29/786* (2013.01); *H01L 29/7869* (2013.01); *H01L 29/78696* (2013.01); *G02F 2001/13685* (2013.01); *G02F 2202/10* (2013.01); *H01L 21/82385* (2013.01); *H01L 21/823456* (2013.01); *H01L 27/1225* (2013.01); *H01L 29/0847* (2013.01); *H01L 29/0865* (2013.01); *H01L 29/0869* (2013.01); *H01L 29/41733* (2013.01); *H01L 29/4908* (2013.01); *H01L 51/5209* (2013.01)

(58) Field of Classification Search
CPC ......... H01L 51/5209; H01L 21/823456; H01L 21/82385
See application file for complete search history.

(56) References Cited

U.S. PATENT DOCUMENTS

| | | | | |
|---|---|---|---|---|
| 7,023,021 | B2 * | 4/2006 | Yamazaki | G02F 1/13454 257/98 |
| 7,951,654 | B2 * | 5/2011 | Tanaka | H01L 21/2026 438/150 |
| 8,541,804 | B2 * | 9/2013 | Kimura | G09G 3/3225 257/236 |
| 8,716,073 | B2 * | 5/2014 | Yamazaki | H01L 29/7869 257/43 |
| 9,455,333 | B2 * | 9/2016 | Lee | H01L 29/7869 |
| 2001/0055830 | A1 * | 12/2001 | Yoshimoto | H01L 27/1281 438/48 |
| 2002/0014628 | A1 * | 2/2002 | Koyama | G09G 3/30 257/72 |
| 2002/0021378 | A1 * | 2/2002 | Murade | G02F 1/136227 349/43 |
| 2002/0102776 | A1 * | 8/2002 | Yamazaki | H01L 27/12 438/149 |
| 2004/0227197 | A1 * | 11/2004 | Maekawa | C23C 16/347 257/410 |
| 2007/0176943 | A1 | 8/2007 | Cho | |
| 2007/0224740 | A1 * | 9/2007 | Fukuda | H01L 27/1214 438/149 |
| 2010/0231124 | A1 * | 9/2010 | Song | H01L 27/3276 313/504 |
| 2012/0138922 | A1 | 6/2012 | Yamazaki et al. | |
| 2014/0001466 | A1 | 1/2014 | Sasaki et al. | |
| 2014/0131673 | A1 * | 5/2014 | Kim | H01L 51/56 257/40 |
| 2014/0138678 | A1 * | 5/2014 | Ito | H01L 29/7869 257/43 |
| 2015/0162452 | A1 * | 6/2015 | Koezuka | H01L 29/78606 257/43 |
| 2015/0263174 | A1 | 9/2015 | Yamazaki et al. | |
| 2015/0311245 | A1 | 10/2015 | Yamazaki et al. | |

FOREIGN PATENT DOCUMENTS

| | | |
|---|---|---|
| JP | 2012134475 A | 7/2012 |
| JP | 2014030002 A | 2/2014 |
| JP | 2015188080 A | 10/2015 |
| JP | 2015216369 A | 12/2015 |

* cited by examiner (A)

(B)

(A)

(B)

(C)

(A)

(B)

(C)

SEMICONDUCTOR DEVICE HAVING LOW RESISTANCE SOURCE AND DRAIN REGIONS

TECHNICAL FIELD

The present invention relates to semiconductor devices, methods for manufacturing the same, and display devices including the same, particularly to a semiconductor device having top-gate structure, a method for manufacturing the same, and a display device including the same.

BACKGROUND ART

There are numerous cases where a thin-film transistor (TFT) having a top-gate structure is used as a switching element formed in each pixel formation portion of a liquid crystal display device. In such a TFT having a top-gate structure, a gate electrode and a gate oxide film are formed such that side surfaces are substantially vertical to a semiconductor layer. For example, Patent Document 1 discloses a TFT which is formed such that side surfaces of a gate electrode are substantially vertical to a semiconductor layer made of an oxide semiconductor. In this case, hydrogen contained in a silicon nitride film (SiNx) formed on the semiconductor layer spreads into the semiconductor layer, whereby low-resistance regions, which serve as source and drain regions of the TFT, are formed in the semiconductor layer. Moreover, Patent Document 2 describes a TFT having a top-gate structure with a gate electrode whose side surfaces are tapering.

CITATION LIST

Patent Documents

Patent Document Japanese Laid-Open Patent Publication No. 2014-30002
Patent Document 2: Japanese Laid-Open Patent Publication No. 2007-206698

SUMMARY OF THE INVENTION

Problems to be Solved by the Invention

As source gases for use in forming a silicon nitride film on the semiconductor layer, silane ($SiH_4$) and ammonia ($NH_3$) gases, which contain an abundance of hydrogen atoms, are used. The hydrogen contained in these gases is thought to be included in part as hydrogen radicals or ions in the formed silicon nitride film, but details remain unknown. Accordingly, such hydrogen radicals, ions, or the like contained in the silicon nitride film will be collectively referred to herein as "hydrogen". During a thermal treatment process performed after the formation of the silicon nitride film, hydrogen contained in the silicon nitride film spreads from the silicon nitride film into the semiconductor layer. After spreading into the semiconductor layer, the hydrogen reduces the oxide semiconductor of which the semiconductor layer is made, so that carriers are generated, thereby forming low-resistance regions in the semiconductor layer.

FIG. 14 is a cross-sectional view of the conventional TFT 500 described in Patent Document 1. Hydrogen contained in the silicon nitride film 550 spreads into the semiconductor layer 520 in contact with the silicon nitride film 550, so that the source region 520s and the drain region 520d, which are low-resistance regions, are formed, and the hydrogen further spreads through the semiconductor layer 520 to a region below the gate electrode 540. As a result, the source region 520s and the drain region 520d expand in the semiconductor layer 520 to positions P1 below the gate electrode 540, as shown in FIG. 14. In this manner, the source region 520s and the drain region 520d expand in the semiconductor layer 520 and reach below the gate electrode 540, thereby creating parasitic capacitance with the gate electrode 540, which is opposite each of the regions with the gate insulating film 530 positioned therebetween. More specifically, the parasitic capacitance is created in portions, each having a length D, and in each of the portions, the gate electrode 540 overlaps the source region 520s or the drain region 520d.

If the TFT 500 as above is used as a switching element provided in each pixel formation portion of a liquid crystal display device, the load of driving scanning signal lines increases, resulting in difficulty in achieving high-speed drive of the liquid crystal display device and high-definition image display on the liquid crystal display device. Moreover, if the source region 520s and the drain region 520d further expand in the region below the gate electrode 540, the length of a channel region 520c (the channel length) decreases, so that the TFT 500 operates unstably. In addition, if the source region 520s and the drain region 520d expand across the entire region below the gate electrode 540, the channel region 520c disappears correspondingly, so that the TFT 500 cannot operate normally.

Furthermore, in the TFT having a top-gate structure described in Patent Document 2, the semiconductor layer is made of silicon, and the source and drain regions formed in the semiconductor layer include LDD (lightly doped drain) regions. However, Patent Document 2 does not mention parasitic capacitance created by the gate electrode overlapping the LDD regions.

Therefore, an objective of the present invention is to provide a semiconductor device having a top-gate structure resistant to creation of parasitic capacitance between a low-resistance region formed in a semiconductor layer and a gate electrode, and also to provide a method for manufacturing the same and a display device including the same.

Means for Solving the Problems

A first aspect of the present invention is directed to a semiconductor device according to the first aspect of the present invention including:
a semiconductor layer formed on an insulating substrate;
a gate insulating film having tapering side surfaces and formed on the semiconductor layer;
a gate electrode having tapering side surfaces and formed on the gate insulating film;
a source region and a drain region formed in the semiconductor layer on opposite sides with respect to the gate electrode;
a silicon nitride film formed on the source region and the drain region of the semiconductor layer; and
a source electrode layer and a drain electrode layer respectively in ohmic contact with the source region and the drain region, wherein,
the source region and the drain region are low-resistance regions formed through reduction caused by hydrogen contained in the silicon nitride film, and
the low-resistance region has a portion with a first length ranging from a first position on the semiconductor layer corresponding to an end of the gate insulating film to a region below the gate electrode, the first length being substantially equal to a second length ranging from the first position to a second position on the semiconductor layer corresponding to an end of the gate electrode.

A second aspect of the present invention provides the semiconductor device according to the first aspect of the present invention, wherein the absolute value of the difference between the first length and the second length is greater than or equal to 0 μm hut less than or equal to 0.5 μm.

A third aspect of the present invention provides the semiconductor device according to the first aspect of the present invention, wherein the first length is equal to the second length or longer than the second length by 0.5 μm or less.

A fourth aspect of the present invention provides the semiconductor device according to the first aspect of the present invention, wherein the semiconductor layer includes an oxide semiconductor.

A fifth aspect of the present invention provides the semiconductor device according to the fourth aspect of the present invention, wherein the oxide semiconductor is indium gallium zinc oxide.

A sixth aspect of the present invention provides the semiconductor device according to the fifth aspect of the present invention, wherein the indium gallium zinc oxide is crystalline.

A seventh aspect of the present invention is directed to a method for manufacturing a semiconductor device including a semiconductor layer formed of an oxide semiconductor on an insulating substrate, a gate insulating film having tapering side surfaces and formed on the semiconductor layer, a gate electrode having tapering side surfaces and formed on the gate insulating film, a source region and a drain region being low-resistance regions formed in the semiconductor layer on opposite sides with respect to the gate electrode, a silicon nitride film formed on the source region and the drain region of the semiconductor layer, and a source electrode layer and a drain electrode layer respectively in ohmic contact with the source region and the drain region, the method including the steps of:

determining a first length of a portion of the low-resistance region on the basis of a condition for thermal treatment performed after the formation of the silicon nitride film, the first length ranging from a position corresponding to an end of the gate insulating film to a channel region below the gate electrode;

selecting from among a plurality of predetermined processing conditions a processing condition for forming the gate electrode and the gate insulating film by etching such that the first length is substantially equal to a second length from the first position to a second position on the semiconductor layer corresponding to an end of the gate electrode;

forming the semiconductor layer on the insulating substrate;

sequentially forming the gate insulating film and a metal film serving as the gate electrode on the semiconductor layer;

forming a resist pattern on the metal film;

forming the gate electrode and the gate insulating film by etching the metal film and the gate insulating film using the resist pattern as a mask under the selected processing condition;

forming the silicon nitride film on the source region and the drain region; and performing thermal treatment such that hydrogen contained in the silicon nitride film spreads into the semiconductor layer.

An eighth aspect of the present invention provides the semiconductor device according to the seventh aspect of the present invention, wherein, the step of selecting the processing condition for forming the gate electrode and the gate insulating film from, among the predetermined processing conditions includes selecting, from among a plurality of predetermined post-bake setting temperatures, a post-bake setting temperature required for the side surfaces of the gate insulating film to have an inclination angle corresponding to the first length in the step of forming the resist pattern by patterning a photoresist applied to the metal film, and the step of forming the resist pattern includes:
applying the photoresist to the metal film;
forming the resist pattern by patterning the photoresist; and
performing a post-bake on the resist pattern at the selected post-bake setting temperature.

A ninth aspect of the present invention is directed to a display device including:

a display portion including a plurality of scanning signal lines formed on an insulating substrate, a plurality of data signal lines crossing each of the scanning signal lines, and a plurality of pixel formation portions disposed in a matrix so as to correspond to intersections of the scanning signal lines and the data signal lines;

a scanning signal line driver circuit configured to sequentially activate and thereby select the scanning signal lines; and a data signal line driver circuit configured to apply a voltage to the data signal lines in accordance with image data, wherein, each of the pixel formation portions formed in the display portion includes:
a semiconductor device of claim 1; and
a pixel capacitor configured to hold the image data provided via the data signal line by the semiconductor device being switched between on and off states, and the pixel capacitor is formed above the semiconductor device and includes a first electrode connected to the data signal line via the semiconductor device, a second electrode disposed opposite the first electrode, and an insulating layer sandwiched between the first electrode and the second electrode.

A tenth aspect of the present invention is directed to a display device including:

a display portion including a plurality of scanning signal lines formed on an insulating substrate, a plurality of data signal lines crossing each of the scanning signal lines, and a plurality of pixel formation portions disposed in a matrix so as to correspond to intersections of the scanning signal lines and the data signal lines;

a scanning signal line driver circuit configured to sequentially activate and thereby select the scanning signal lines; and a data signal line driver circuit configured to apply a voltage to the data signal lines in accordance with image data, wherein, each of the pixel formation portions formed in the display portion includes:
a semiconductor device of claim 1; and
a pixel capacitor configured to hold the image data provided via the data signal line by the semiconductor device being switched between on and off states, and the pixel capacitor includes a first electrode connected to the data signal line via the semiconductor device, a second electrode disposed opposite the first electrode, and an insulating layer sandwiched between the first electrode and the second electrode, the first electrode being formed on the outside with respect to a drain region formed in the semiconductor layer of the semiconductor device, the second electrode being formed on an insulating film stacked above the semiconductor layer, so as to be opposite the first electrode.

Effect of the Invention

In the first aspect of the present invention, the side surfaces of the gate electrode and the gate insulating film are formed in tapering shape. The low-resistance region is formed such that a portion thereof has the first length, which ranges from the first position corresponding to the end of the gate insulating film to a region below the gate electrode, and the first length is substantially equal to the second length ranging from the first position to the second position corresponding to the end of the gate electrode. Thus, the overlap between the low-resistance region and the gate electrode can be reduced, resulting in diminished parasitic capacitance caused by such overlap.

In the second aspect of the present invention, the absolute value of the difference between the first length and the second length is greater than or equal to 0 µm but less than or equal to 0.5 µm, whereby the semiconductor device can operate with reduced parasitic capacitance.

In the third aspect of the present invention, the first length is equal to the second length or longer than the second length by 0.5 µm or less, whereby the parasitic capacitance can be reduced without decreasing the on-state current of the semiconductor device.

In the fourth aspect of the present invention, the semiconductor layer includes an oxide semiconductor layer, whereby the leakage current of the semiconductor device can be reduced.

In the fifth aspect of the present invention, the oxide semiconductor is indium gallium zinc oxide, and therefore, effects similar to those achieved by the fourth aspect of the invention can be achieved.

In the sixth aspect of the present invention, the indium gallium zinc oxide is crystalline, whereby the threshold voltage of the semiconductor device can be inhibited from varying, resulting in stable characteristics.

In the seventh aspect of the present invention, the first length from the first position corresponding to the end of the gate insulating film to the end of the low-resistance region is determined on the basis of a condition for thermal treatment performed after the formation of the silicon nitride film, and one of the etching conditions for the gate insulating film is selected such that the second length from the first position to the second position corresponding to the end of the gate insulating film is substantially equal to the first length. Thereafter, the gate electrode and the gate insulating film are etched under the selected condition. Thus, the overlap between the gate electrode and the low-resistance region can be reduced, resulting in diminished parasitic capacitance.

In the eighth aspect of the present invention, one of the post-bake setting temperatures for the resist pattern used in etching the gate electrode and the gate insulating film is selected such that the gate insulating film has a desired inclination angle. Thus, the overlap between the gate electrode and the low-resistance region can be reduced, resulting in diminished parasitic capacitance.

The ninth aspect of the present invention renders it possible to eliminate the need to take account of parasitic capacitance at the time of designing a display device in which semiconductor devices with reduced parasitic capacitance are used as switching elements of pixel formation portions, whereby it is possible to achieve a higher aperture ratio and a higher contrast ratio for the display device, and further, it is possible to improve display quality.

The tenth aspect of the present invention, as with the ninth aspect of the invention, renders it possible to achieve a higher aperture ratio and a higher contrast ratio, and further, renders it possible to improve display quality. In addition, when a pixel capacitor is formed, there is no need to additionally form an organic interlayer film, a pixel insulating film, and a pixel electrode, and therefore, it is possible to shorten the process for manufacturing a display device and also reduce the manufacturing cost thereof.

MODES FOR CARRYING GUT THE INVENTION

1. First Embodiment

The structure of a TFT according to a first embodiment of the present invention, along with a method for manufacturing the same, will be described with reference to the drawings.

<1.1 Structure of the TFT>

Figure 1:
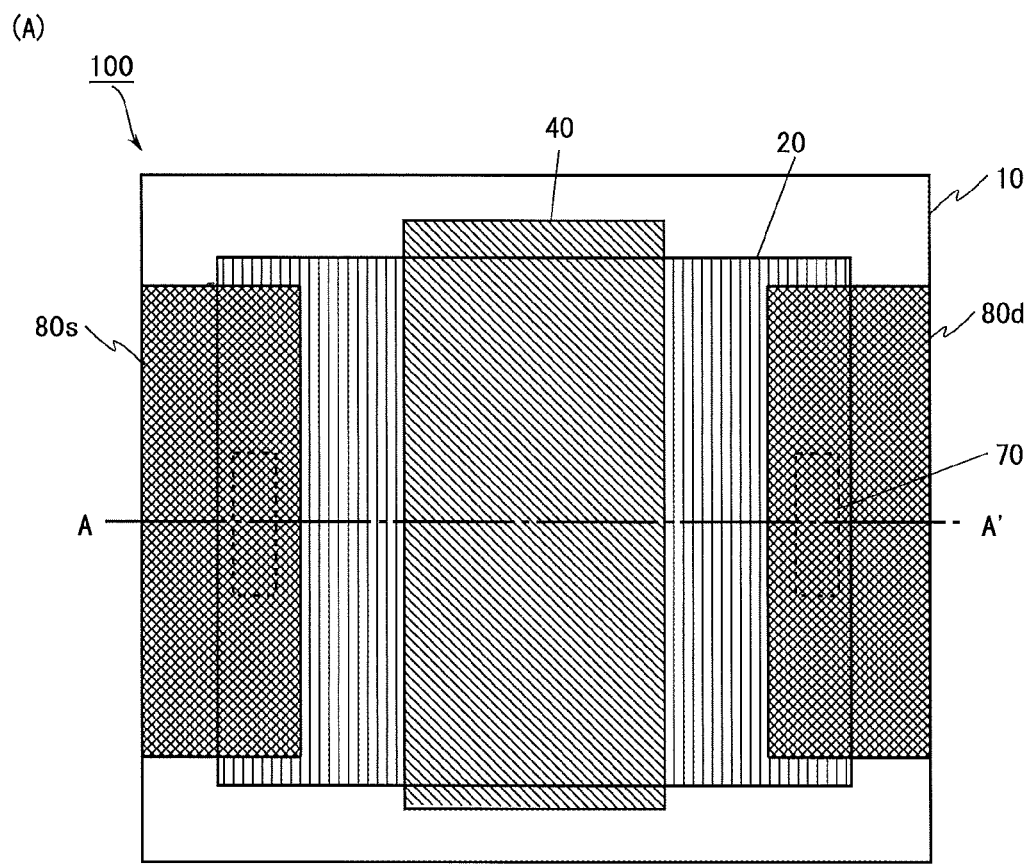
FIG. 1 provides a top view and a cross-sectional view illustrating the structure of a TFT according to a first embodiment of the present invention; more specifically, part (A) is the top view of the TFT, and part (B) is the cross-sectional view of the TFT taken along long-dash dot line A-A' shown in part (A).
Figure 1:
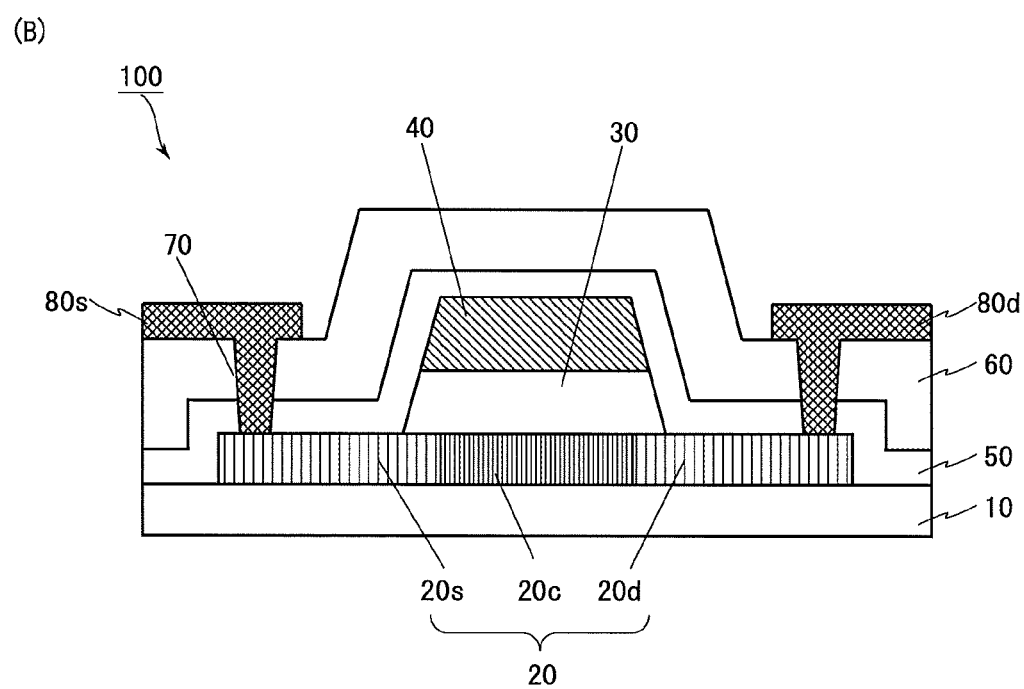

FIG. 1 provides a top view and a cross-sectional view illustrating the structure of the TFT 100 according to the first embodiment of the present invention; more specifically, FIG. 1(A) is the top view of the TFT 100, and FIG. 1(B) is the cross-sectional view of the TFT 100 taken along long-dash dot line A-A' shown in FIG. 1(A). Note that although a gate insulating film 30, a silicon nitride film 50, which covers a gate electrode 40 and a semiconductor layer 20, and an interlayer insulating film 60 are shown in FIG. 1(B), these films are omitted in FIG. 1(A) for the sake of clarity.

As shown in FIGS. 1(A) and 1(B), the semiconductor layer 20 is formed on an insulating substrate 10 such as a glass substrate. The semiconductor layer 20 is made of an oxide semiconductor, such as an In—Ga—Zn—O based semiconductor with a thickness of from 50 to 150 nm. The In—Ga—Zn—O based semiconductor is a ternary oxide of indium (In), gallium (Ga), and zinc (Zn), and non-limiting examples of the ratio (composition ratio) among indium, gallium, and zinc include In:Ga:Zn=2:2:1, In:Ga:Zn=1:1:1, and In:Ga:Zn=1:1:2. Described herein is a case where the In—Ga—Zn—O based semiconductor used as the oxide semiconductor contains In, Ga, and Zn at a ratio of 1:1:1.

The TFT 100, which includes the semiconductor layer 20 made of the In—Ga—Zn—O based semiconductor, exhibits characteristics with high mobility (more than 20 times the mobility of a-Si TFTs) and low leakage current (less than $\frac{1}{100}$ of the leakage current of a-Si TFTs). Accordingly, the TFT 100 can be suitably used as a drive TFT included in a source or gate driver of a display device or a pixel TFT serving as a switching element of each pixel formation portion. By using the TFT 100 with the semiconductor layer 20 made of the In—Ga—Zn—O based semiconductor for a display device, it is rendered possible to significantly reduce power consumption of the display device.

The In—Ga—Zn—O based semiconductor may be amorphous or may include crystalline portions. Such a crystalline In—Ga—Zn—O based semiconductor preferably has a c-axis oriented substantially vertically to the layer surface. The crystal structure of such a crystalline In—Ga—Zn—O based semiconductor is disclosed in, for example, Japanese Laid-Open Patent Publication No. 2012-134475. The disclosure of Japanese Laid-Open Patent Publication No. 2012-134475 is incorporated herein by reference in its entirety. By using the crystalline In—Ga—Zn—C based material for the semiconductor layer 20 of the TFT 100, it is rendered possible to further inhibit leakage current.

The oxide semiconductor may be an oxide semiconductor other than the In—Ga—Zn—O based semiconductor. Examples of such an oxide semiconductor include a Zn—O based semiconductor (ZnC), an In—Zn—C based semiconductor (IZC (registered trademark)), a Zn—Ti—O based semiconductor (ZTO), a Cd—Ge—C based semiconductor, a Cd—Pb—C based semiconductor, a CdC (cadmium oxide), an Mg—Zn—C based semiconductor, an In—Sn—Zn—C based semiconductor (e.g., $In_2O_3SnO_2$—ZnO), and an In—Ga—Sn—C based semiconductor. Moreover, the semiconductor layer 20 may be a film stack obtained by stacking a plurality of semiconductor layers made of any of the oxide semiconductors.

Formed on the semiconductor layer 20 is the gate insulating film 30. The gate insulating film 30 is, for example, a film stack obtained by sequentially stacking two layers of insulating film, which are, from the semiconductor layer 20 side, a silicon oxide film ($SiO_2$) with a thickness of from 40 to 60 nm and a silicon nitride film 50 with thickness of from 300 to 400 nm. The reason why the silicon oxide film is used as the insulating film in contact with the semiconductor layer 20 is that hydrogen contained in the silicon nitride film spreads into the semiconductor layer 20 and reduces an oxide semiconductor below the gate electrode 40 to be described later, thereby preventing a channel region 20c of the semiconductor layer 20 from disappearing. Note that instead of stacking the silicon nitride film on the silicon oxide film, a silicon oxynitride film ($SiONx$) may be stacked on the silicon oxide film.

Formed on the gate insulating film 30 is the gate electrode 40. The gate electrode 40 is, for example, a stack of two metal films extending over the central portion of the semiconductor layer 20 in a direction perpendicular to the longitudinal direction of the semiconductor layer 20. More specifically, the gate electrode 40 is a film stack obtained by stacking, sequentially from the gate insulating film 30 side, a tantalum nitride film (TaN) with a thickness of from 20 to 50 nm and a tungsten film (W) with a thickness of from 200 to 450 nm. Note that the gate electrode 40 may be a metal film stack obtained by sequentially stacking a titanium film (Ti), an aluminum film (Al), and another titanium film, a single-layer film made of molybdenum (Mo), tantalum (Ta), tungsten, or copper (Cu), or an alloy film consisting of such single-layer films.

Of all side surfaces of the gate insulating film 30 and the gate electrode 40, at least the ones that are perpendicular to the semiconductor layer 20 are tapering, such that each tapering side forms a slope continuing from the gate electrode 40 to the gate insulating film 30.

Formed on the gate electrode 40 and the semiconductor layer 20 is the silicon nitride film 50 with a thickness of from 100 to 300 nm. From the silicon nitride film 50 in contact with the semiconductor layer 20, hydrogen spreads into the semiconductor layer 20 and reduces the oxide semiconductor, so that carriers are generated. As a result, low-resistance regions are formed in the semiconductor layer 20. In this manner, the low-resistance regions are formed on opposite sides with respect to the gate electrode 40 and respectively serve as a source region 20s and a drain region 20d, and a region which is sandwiched between the source region 20s and the drain region 20d below the gate electrode 40 serves as the channel region 20c. Note that to control the expansion of the source region 20s and the drain region 20d, it is necessary to regulate the hydrogen content of the silicon nitride film 50 within a predetermined range, and details thereof will be described later.

Stacked on the silicon nitride film 50 is the interlayer insulating film 60 having a thickness of from 200 to 400 nm and made of silicon oxide ($SiO_2$). Note that as the interlayer insulating film 60, a silicon nitride film, rather than a silicon oxide film, may be stacked.

There are contact holes 70 provided so as to be opposed to each other with respect to the gate electrode 40 and extend through the interlayer insulating film 60 and the silicon nitride film 50 to the source region 20s and the drain region 20d, respectively, of the semiconductor layer 20. Formed in and over the contact holes 70 are a source electrode layer 80s and a drain electrode layer 80d, which are in ohmic contact with the source region 20s and the drain region 20d, respectively, and extend so as to be away from each other (in the right-left direction in FIG. 1(B)). Each of the source electrode layer 80s and the drain electrode layer 80d is, for example, a metal film stack obtained by stacking a titanium film with a thickness of from 40 to 60 nm, an aluminum film with a thickness of from 150 to 250 nm, and another titanium film with a thickness of from 40 to 60 nm, in this order. Note that each of the source electrode layer 80s and the drain electrode layer 80d may be a film stack obtained by stacking a titanium film and a copper film, a single-layer film made of tungsten, molybdenum, aluminum, titanium, or copper, an alloy film made of such substances, or a stack of such films.

<1.2 Parasitic Capacitance>

Figure 2:
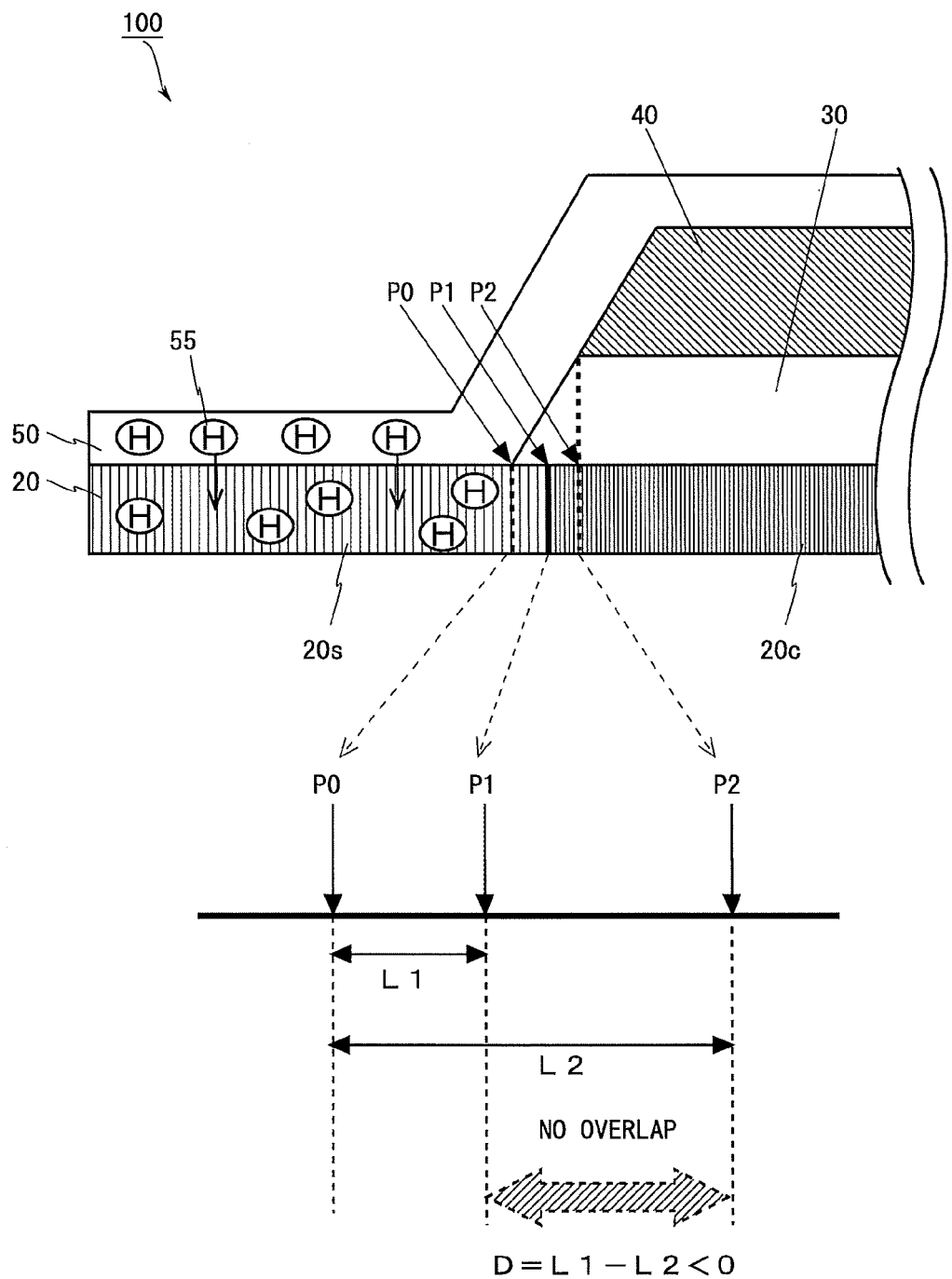
FIG. 2 is a cross-sectional view of the TFT shown in FIG. 1, showing the positional relationship between a gate electrode and a source region of a semiconductor layer where no parasitic capacitance is created.
Figure 3:
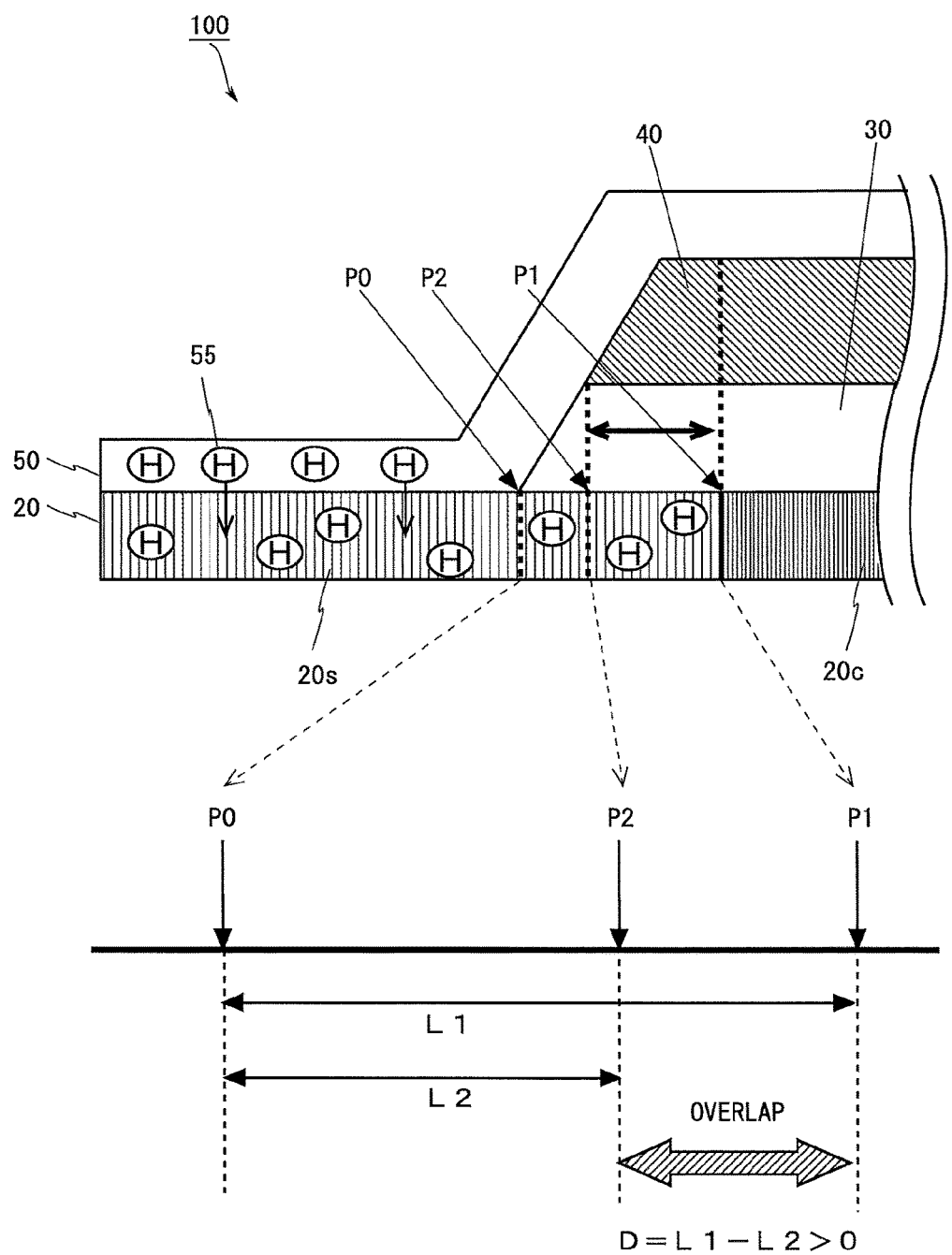
FIG. 3 is a cross-sectional view of the TFT shown in FIG. 1, showing the positional relationship between the gate electrode and the source region of the semiconductor layer where parasitic capacitance is created.

FIG. 2 is a cross-sectional view of the TFT 100, showing the positional relationship between the gate electrode 40 and the source region 20s of the semiconductor layer 20 where no parasitic capacitance is created. FIG. 3 is a cross-sectional view of the TFT 100, showing the positional relationship between the gate electrode 40 and the source region 20s of the semiconductor layer 20 where parasitic capacitance is created. Low-resistance regions are formed by hydrogen 55 spreading from the silicon nitride film. 50 into and within the semiconductor layer 20. Of these low-resistance regions, FIG. 2 shows the source region 20s expanding to position P1. Note that the following descriptions about the source region 20s can also be applied to the drain region 20d.

In the case shown in FIG. 2, position P1, which indicates the end of the source region 20s, lies between positions P0 and P2 on the semiconductor layer 20, in which position P0 corresponds to the end of the tapering side surface of the gate insulating film 30, and position P2 corresponds to the end of the side surface of the gate electrode 40. Accordingly, the semiconductor layer 20 has a high-resistance region below the gate electrode 40, and the high-resistance region serves as the channel region 20c of the TFT 100. When viewed in a plan view, the gate electrode 40 and the source region 20s have overlap whose length D is represented by expression (1) below based on length L1 from position P0 to position P1 (first length L1) and length L2 from position P0 to position P2 (second length L2).

$$D = L1 - L2 \quad (1)$$

in this case, second length L2 is longer than first length L1, and therefore, from expression (1), overlap length D is negative, i.e., there is no overlap between the source region 20s and the gate electrode 40, resulting in no parasitic capacitance. However, even when overlap length D between the source region 20s and the gate electrode 40 is negative, hence resulting in the TFT 100 being in offset condition, if the absolute value of the overlap length is 0.5 μm or less, the TFT 100 operates normally. However, the drain current that flows when the TFT 100 is in ON state (i.e., on-state current) is lower than in the case where overlap length D is positive.

When hydrogen spreads farther to such an extent that position P1 at the end of the source region 20s moves toward the inside (in FIG. 3, the left side) past position P2 on the semiconductor layer 20, which corresponds to the end of the side surface of the gate electrode 40, as shown in FIG. 3, first length L1 is longer than second length L2. As a result, from expression (1), overlap length D is positive, and therefore, when viewed in a plan view, the source region 20s and the gate electrode 40 overlap each other, so that parasitic capacitance is created.

When there is overlap between the gate electrode 40 and the source region 20s, the TFT 100 operates normally, and the on-state current is high. However, if overlap length D becomes greater than 0.5 μm, the parasitic capacitance becomes excessively large. Accordingly, if the TFT 100 is used as a switching element of each pixel formation portion of a liquid crystal display device, the load of driving scanning signal lines increases, resulting in difficulty in achieving high-speed drive. Therefore, overlap length D is required to be 0.5 μm or less. Moreover, in the case where first length L1 and second length L2 are equal, overlap length D is 0 μm, but the TFT 100 operates normally, and the value of the on-state current is about the same as that in the case where overlap length D is positive.

Accordingly, the difference between first length L1 and second length L2 in the TFT 100 is set within the range from −0.5 μm or higher to 0.5 μm or lower (in the following, the range is shown as "from −0.5 to 0.5 μm"). More specifically, by setting the absolute value at 0.5 μm or lower, it is rendered possible to cause no parasitic capacitance, or if any parasitic capacitance is caused, substantially eliminate the influence of the parasitic capacitance. More preferably, overlap length D is set within the range from 0 μm or higher to 0.5 μm or lower (in the following, the range is shown as "from 0 to 0.5 μm") because the on-state current does not decrease. Note that the wording "first length L1 and second length L2 are substantially equal" is intended herein to mean not only the case where overlap length D is 0 μm but also the case where overlap length D is in the range from −0.5 to 0.5 μm.

Figure 4:
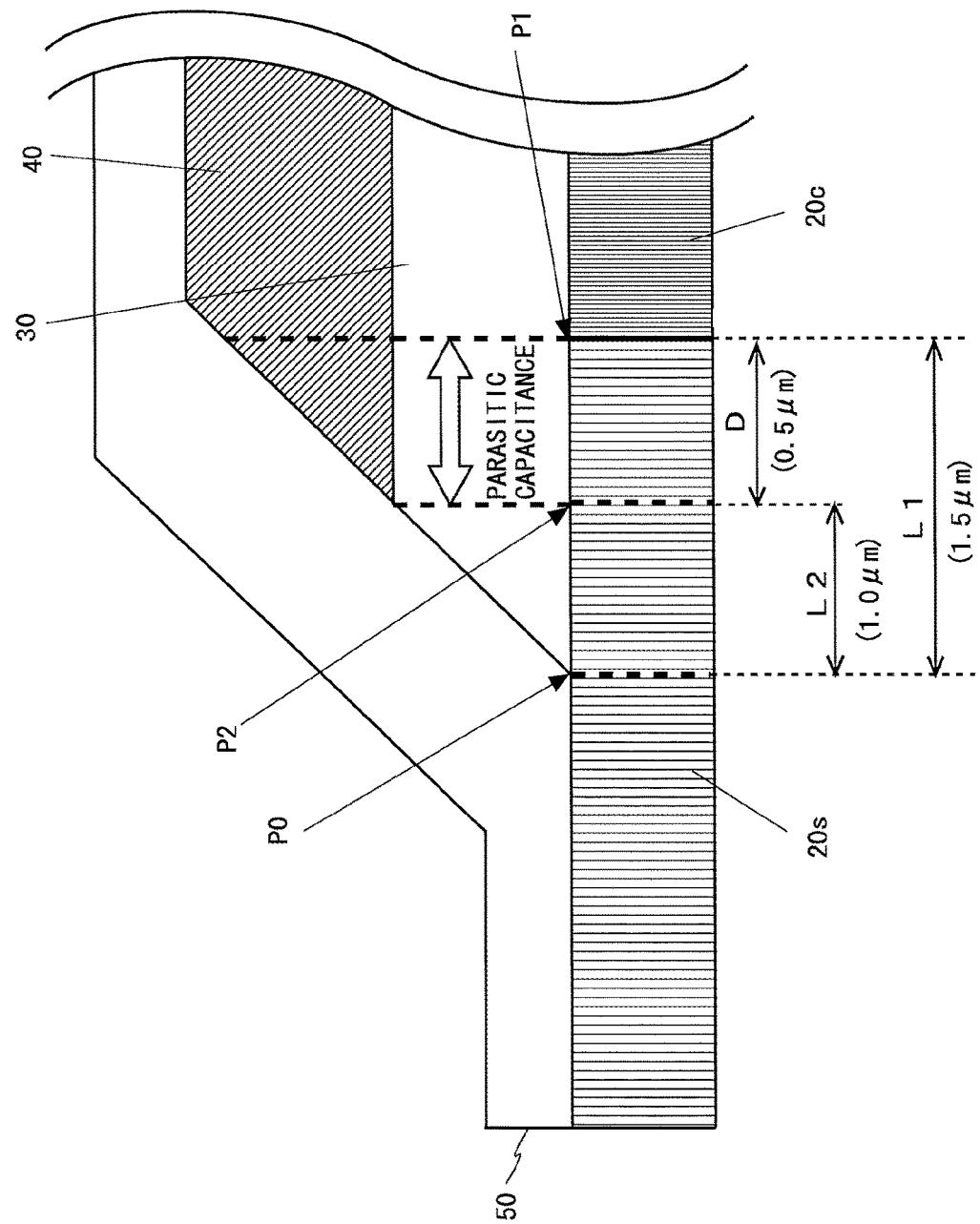
FIG. 4 is a cross-sectional view of the TFT shown in FIG. 1, showing the relationship among dimensions where parasitic capacitance is created between the gate electrode and the source region of the semiconductor layer.

FIG. 4 is a cross-sectional view describing a method for adjusting overlap length D to 0.5 μm in the TFT 100. First length L1 from position P0 on the semiconductor layer 20, which corresponds to the end of the side surface of the gate insulating film 30, to position P1 at the end of the source region 20s, as shown in FIG. 4, is determined by the conditions for thermal treatment performed after the formation of the silicon nitride film 50. For example, in the case where annealing is performed at 220° C. for 40 minutes after the formation of the silicon nitride film 50, first length L1 is about 1.5 μm.

Furthermore, second length L2 from position P0 to position P2, which corresponds to the end of the side surface of the gate electrode, is determined by the thickness of the gate insulating film 30 and the inclination angle (taper angle) of the side surface of the gate insulating film 30. For example, the thickness of the gate insulating film 30 is from 340 to 460 nm as is implicit from the foregoing. In the case where first length L1 is about 1.5 μm, when overlap length D is about 0.5 μm, second length L2 is required to be about 1 μm. Accordingly, given the thickness of the gate insulating film 30, the gate insulating film 30 is formed by etching under such processing conditions that the inclination angle of the side surface is 20 degrees. As a result, first length L1 can be longer than second length L2 by about 0.5 μm. Note that the specific etching conditions will be described later. The inclination angle (taper angle) refers to the angle between the tapering side surface of the gate insulating film 30 and the surface of the semiconductor layer 20.

In the case described above, first length L1 is about 1.5 µm, and second length L2 is about 1 µm. However, first length L1 varies within the range from 0.5 to 2.5 µm depending on the thermal treatment conditions for the silicon nitride film 50, and therefore, second length L2 is changed accordingly within the range from 0.5 to 2 µm, thereby setting overlap length D to be from 0 to 0.5 µm. Moreover, the above adjustments can be made similarly regardless whether overlap length D is positive or negative. In this manner, in the case where first length L1 and overlap length D are changed, second length L2 is adjusted accordingly in the manner described above. To this end, data as below needs to be obtained in advance. First length L1 is determined by the temperature and the duration of the thermal treatment process performed after the formation of the silicon nitride film 50, and therefore, data is obtained regarding the relationship between thermal treatment conditions and first length L1 for various combinations of the temperature and the duration of the thermal treatment process. Second length L2 is determined by the thickness of the gate insulating film 30 and the inclination angle of the side surface of the gate insulating film 30, and therefore, data is obtained regarding the relationship between the thickness of the gate insulating film 30 and second length L2 for various combinations of processing conditions in forming the gate insulating film 30. Once the temperature and the duration of the thermal treatment process for the silicon nitride film 50 are determined, the thickness of the gate insulating film 30 and the processing conditions in forming the gate insulating film 30 are selected from among the data, whereby overlap length D can be adjusted to a desired value.

Accordingly, to set second length L2 at about 1 µm, the inclination angle of the side surfaces of the gate electrode 40 and the gate insulating film 30 is obtained as about 20 degrees. Therefore, from among data prepared regarding the relationship between the inclination angle of the side surface of the gate insulating film 30 and the inclination angle (taper angle) of the edge of a resist pattern that is to be used as a mask in forming the gate electrode 40 and the gate insulating film 30 by etching, the inclination angle of the edge of the resist pattern is selected such that the inclination angle of the side surface of the gate insulating film 30 is about 20 degrees, and the setting temperature for a post-bake which realizes the selected inclination angle is determined. Accordingly, etching is performed using a resist pattern formed as a mask, thereby forming a TFT 100 with overlap length D of about 0.5 µm. Thus, it is possible to form the TFT 100 with the parasitic capacitance between the gate electrode 40 and the source region 20s of the semiconductor layer 20 being reduced to such a degree that the parasitic capacitance does not affect drive of the scanning signal lines.

In the foregoing, first length L1 is about 1.5 µm, and second length L2 is about 1 µm, but first length L1 varies within the range from 0.5 to 2.5 µm depending on the thermal treatment conditions for the silicon nitride film 50, and therefore, second length L2 is changed accordingly within the range from 0.5 to 2 µm, thereby setting overlap length D to be from 0 to 0.5 µm. In addition, overlap length can be adjusted similarly regardless whether overlap length D is positive or negative.

Figure 5:
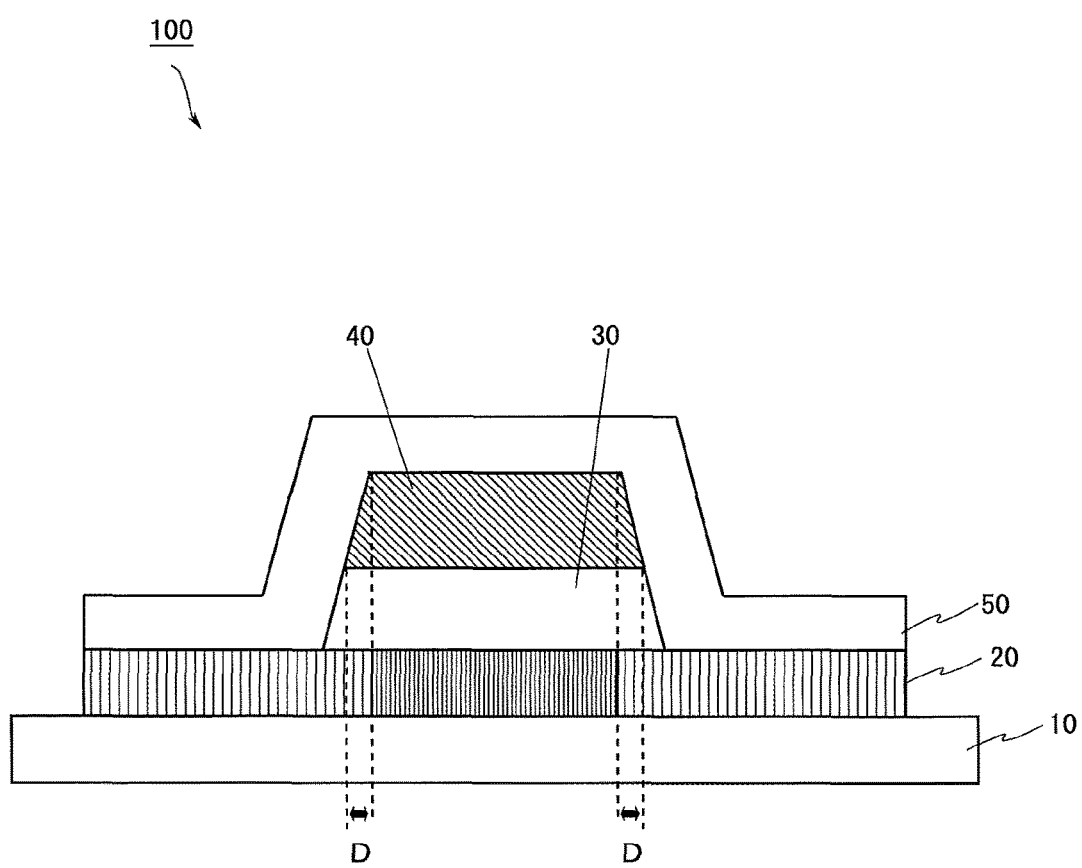
FIG. 5 is a cross-sectional view of the TFT shown in FIG. 1, describing a method for adjusting an overlap length to 0.5 µm.

FIG. 5 is a cross-sectional view of the TFT 100 where overlap length D between the gate electrode 40 and each of the source region 20s and the drain region 20d is from 0 to 0.5 µm. The elements shown in FIG. 5 are the same as those shown in FIG. 1(B) and therefore are denoted by the same reference characters, and any descriptions thereof will be omitted. Overlap length D between the gate electrode 40 and each of the source region 20s and the drain region 20d, as shown in FIG. 5, is set to be from 0 µm or higher to 0.5 µm or lower, thereby minimizing the parasitic capacitance that is caused in the TFT 100 by the gate electrode 40 overlapping the source region 20s or the drain region 20d.

Figure 6:
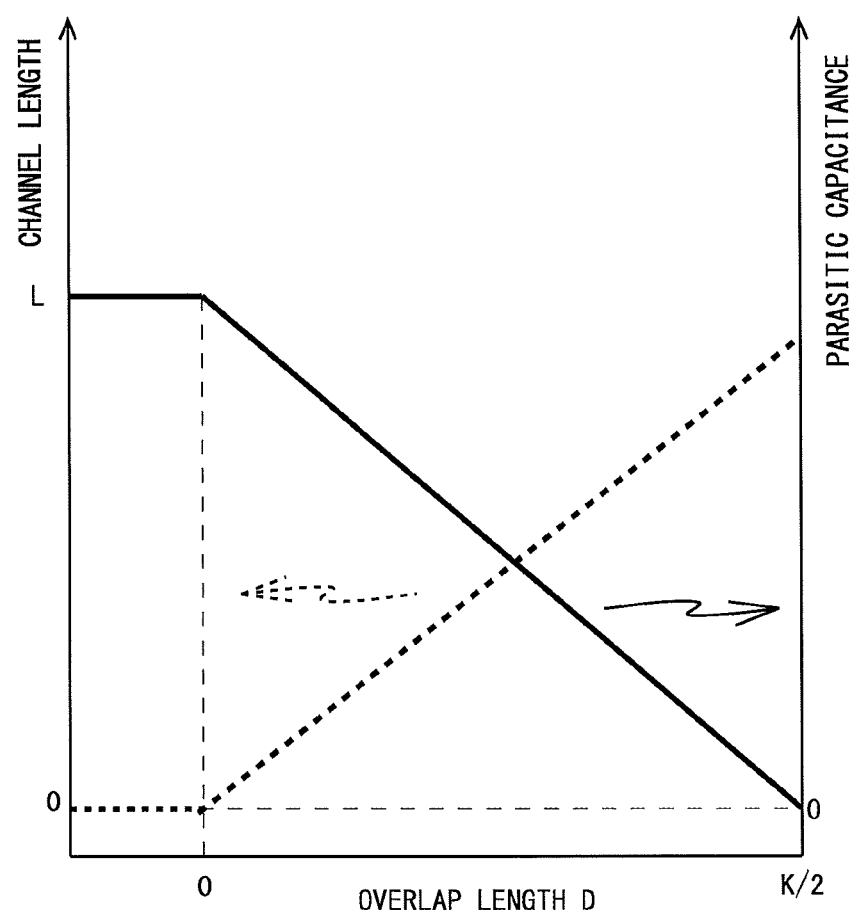
FIG. 6 is a graph showing the relationship of overlap length between the gate electrode and the source region of the semiconductor layer in the TFT shown in FIG. 1, with parasitic capacitance and channel length.

FIG. 6 is a graph showing the relationship of overlap length D between the gate electrode 40 and the source region 20s of the semiconductor layer 20 in the TFT 100, with parasitic capacitance and the length of the channel region 20c (channel length) of the TFT 100. As shown in FIG. 6, when the gate electrode 40 and the source region 20s in the TFT 100 do not overlap at all, parasitic capacitance is "0", and channel length is "K". When overlap length increases from "0", parasitic capacitance increases in proportion to length D, but in contrast, channel length decreases. When overlap length D is "K/2", which is a half of the channel length, the low-resistance region that extends from the source region 20s side and the low-resistance region that extends from the drain region 20d side contact each other at the center of the channel region 20c, so that parasitic capacitance is maximized and channel length becomes "0".

<1.3 Hydrogen Content in the Silicon Nitride Film>

The expansion of the source region 20s and the drain region 20d formed in the semiconductor layer 20 is determined by the amount of hydrogen spreading from the silicon nitride film 50 into the semiconductor layer 20, which is determined by the hydrogen content of the silicon nitride film 50. Accordingly, a method for evaluating the hydrogen content of the silicon nitride film 50 will be described.

In the present invention, the hydrogen content of the silicon nitride film 50 evaluated by thermal desorption spectroscopy (TDS). In TDS, a sample (in the present embodiment, a silicon nitride film) is irradiated with infrared light in a vacuum, thereby raising the temperature of the sample from 80° C. to 700° C. at a rate of 1° C./sec, and the partial pressure of hydrogen gas desorbed from the sample is measured using a quadrupole mass spectrometer (QMS). The partial pressure of hydrogen gas obtained by the QMS is converted to the number of hydrogen molecules in accordance with a known relational expression. The number of hydrogen molecules thus obtained is considered as the amount of hydrogen desorption from the sample. Note that herein, the amount of hydrogen desorption from the silicon nitride film 50 is measured using a "TDS 1200" system manufactured by ESCO, Ltd. The amount of hydrogen desorption thus measured can be conceived to be substantially proportional to the hydrogen content of the silicon nitride film 50, and therefore can be used as an indication of the hydrogen content of the silicon nitride film 50.

In the present embodiment, as for the film that is used as the silicon nitride film 50 from which hydrogen is supplied to the semiconductor layer 20, the number of hydrogen molecules desorbed under the aforementioned conditions is from $1 \times 10^{17}$ to $5 \times 10^{17}$ molecules/cm$^3$. The following is the reason why the aforementioned range is preferred for the number of hydrogen molecules desorbed from the silicon nitride film 50. When the number of molecules is less than $1 \times 10^{17}$ molecules/cm$^3$, the amount of hydrogen spreading from the silicon nitride film 50 into the semiconductor layer 20 is so low that the source region 20s and the drain region 20d formed in the semiconductor layer 20 do not have sufficiently low resistance. When the number of molecules is greater than $5 \times 10^{17}$ molecules/cm$^3$, the source region 20s and the drain region 20d might expand differently, resulting in variations in parasitic capacitance among TFTs, or the source region 20s and the drain region 20d might contact each other at the center of the channel region 20c, with the result that the TFT 100 is always electrically conductive.

In the present embodiment, the silicon nitride film 50 is formed such that the number of desorbed hydrogen molecules as measured by TDS is from $1 \times 10^{17}$ to $5 \times 10^{17}$ molecules/cm$^3$. Accordingly, it is possible to perform control such that there are fewer variations in the expansion of the source region 20s and the drain region 20d formed in the semiconductor layer 20, i.e., length L1 from position P0 on the semiconductor layer 20, which corresponds to the end of the gate insulating film 30, to position P1 at the end of each of the source region 20s and the drain region 20d. Thus, overlap length D between the low-resistance region and the gate electrode 40 can be controlled to be a desired value.

<1.4 Method for Manufacturing the TFT>

Figure 7:
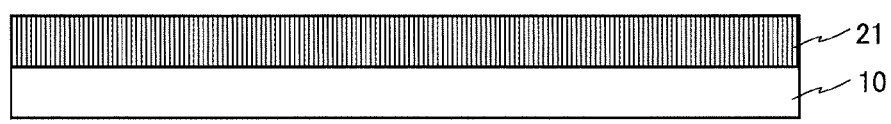
FIGS. 7(A) to 7(C) are step-by-step cross-sectional views illustrating the process for manufacturing the TFT shown in FIG. 1.
Figure 7:
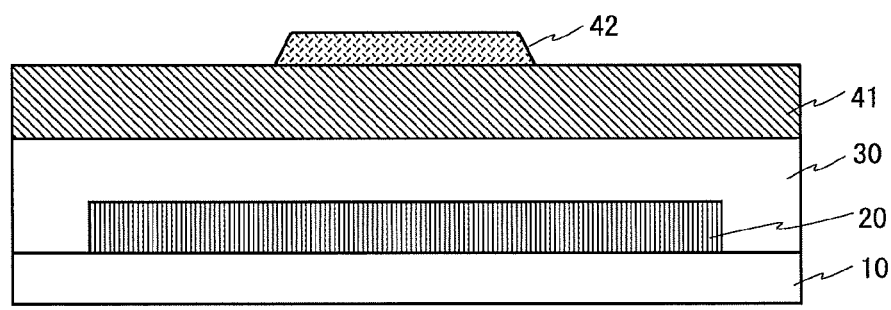
Figure 7:
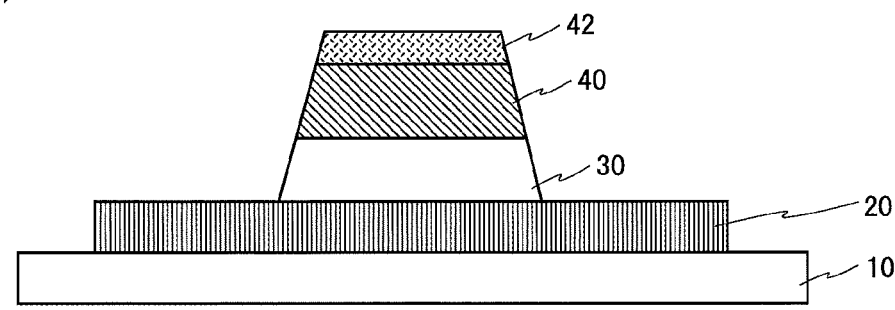

FIGS. 7(A) to 7(C) and 8(A) to 8(C) are step-by-step cross-sectional views illustrating the process for manufacturing the TFT 100. Referring to the step-by-step cross-sectional views, the method for manufacturing the TFT 100 will be described. As shown in FIG. 7(A), on an insulating substrate 10 such as a glass plate, a semiconductor film 21 is formed to a thickness of from 50 to 150 nm by sputtering of an In—Ga—Zn—O based semiconductor. On the semiconductor film 21, a resist pattern (not shown) is formed by photolithography, and the semiconductor film 21 is dry-etched using the resist pattern as a mask, thereby forming a semiconductor layer 20.

On the insulating substrate 10 with the semiconductor layer 20 formed thereon, a silicon oxide film with a thickness of from 40 to 60 nm and a silicon nitride film with a thickness of from 300 to 400 nm are sequentially formed by plasma CVD (chemical vapor deposition), thereby forming a gate insulating film 30, as shown in FIG. 7(B). Further, on the gate insulating film 30, a tantalum nitride film with a thickness of from 20 to 50 nm and a tungsten film with a thickness of from 200 to 450 nm are sequentially formed by sputtering, thereby forming a metal film 41.

Next, a photoresist is applied to the metal film 41 and then patterned using a photomask, thereby forming a resist pattern 42 on the metal film 41, and thereafter, a post-bake is performed. The photoresist used is a novolac resist, and the setting temperature for the post-bake is from 100 to 150° C. When the post-bake is performed under such conditions, the edge of the resist pattern 42 has an inclination angle of from 60 to 80 degrees. Note that the inclination angle of the edge of the resist pattern 42 is optimally selected from among previously obtained inclination angles so as to ensure a desired difference between first length L1, which is determined by the conditions for thermal treatment performed after the formation of the silicon nitride film 50 to be described later, and second length L2, which is determined by the thickness of the gate insulating film 30 and the inclination angle of the side surface thereof, and the post-bake setting temperature is determined correspondingly.

The resist pattern 42 is used as a mask in sequentially etching the tungsten film and the tantalum nitride film included in the metal film 41, as well as the silicon nitride film and the silicon oxide film included in the gate insulating film 30, as shown in FIG. 7(C), by an inductively coupled plasma (ICP) dry-etching device. A mixture of sulfur hexafluoride (SF$_6$), chlorine (Cl$_2$), and oxygen (O$_2$) gases is used, and bias power is from 1500 to 4500 W. In this case, the percentage of the volume of oxygen gas in the entire volume of the mixture is about 40%. The resist pattern 42 serving as the mask is formed such that the edge has an inclination angle of from 60 to 80 degrees, and therefore, the edge of the resist pattern 42 is caused to gradually recede by etching. As the edge of the resist pattern 42 recedes, more region of the metal film 41 and the gate insulating film 30 is etched, and the side surfaces of the films are tapered. In this manner, the gate electrode 40 and the gate insulating film 30 with the tapering side surfaces are formed.

Described now is a method for setting a desired overlap length D by adjusting the inclination angle of the side surfaces of the gate electrode 40 and the gate insulating film 30 when forming the gate electrode 40 and the gate insulating film 30. The inclination angle of the side surfaces of the gate electrode 40 and the gate insulating film 30 is determined by the inclination angle of the edge of the resist pattern 42, which is determined by the post-bake setting temperature, and the higher the post-bake setting temperature, the smaller the inclination angle of the resist pattern 42. Moreover, the inclination angle of the side surfaces of the gate electrode 40 and the gate insulating film 30 decreases with the inclination angle of the resist pattern 42. That is, by raising the post-bake setting temperature, the inclination angle of the side surfaces of the gate electrode 40 and the gate insulating film 30 is diminished. Therefore, from the conditions for thermal treatment performed after the formation of the silicon nitride film 50 to be described later, first length L1 is estimated, and second length L2 is obtained such that overlap length D takes a desired value. Then, the post-bake setting temperature is selected such that the distance between position P0, which corresponds to the end of the etched gate insulating film 30, and position P2, which corresponds to the end of the etched gate electrode 40, is equal to the obtained second length L2. In this manner, overlap length D can be set at a desired value.

Figure 8:
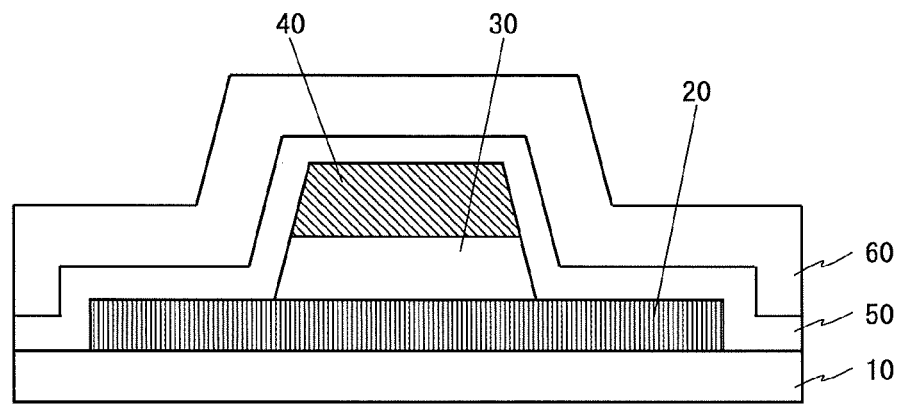
FIGS. 8(A) to 8(C) are step-by-step cross-sectional views continued from FIG. 7, illustrating the process for manufacturing the TFT shown in FIG. 1.
Figure 8:
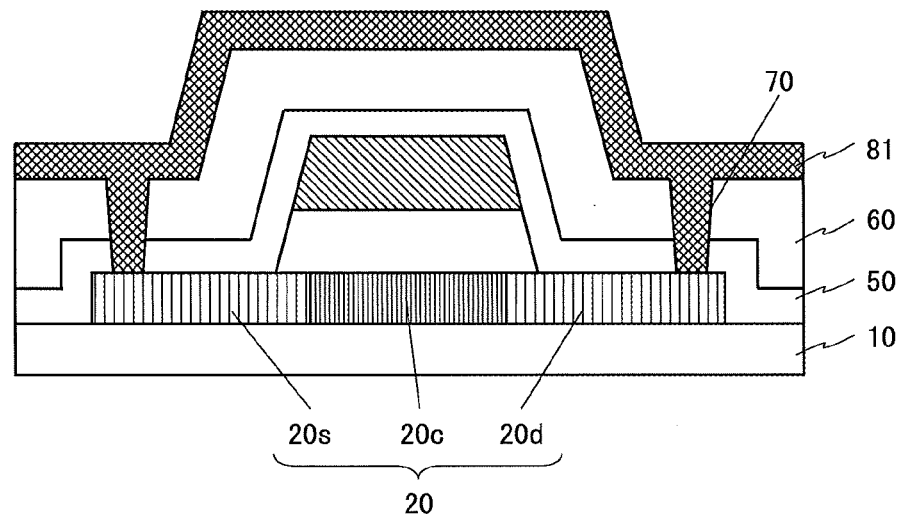
Figure 8:
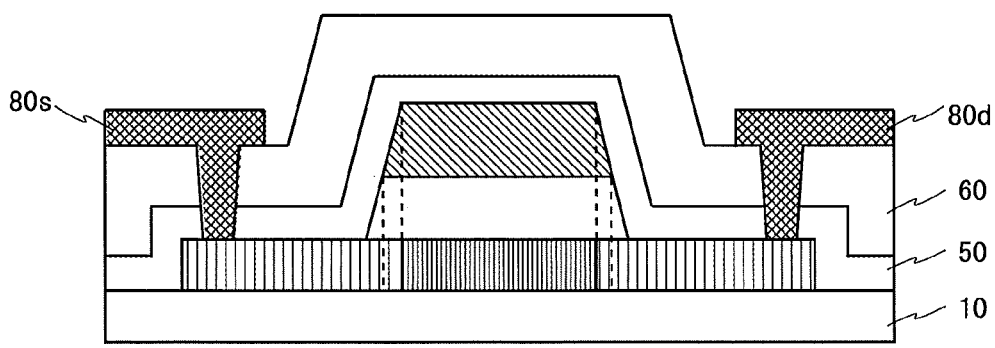

At least on the gate electrode 40 and the semiconductor layer 20, a silicon nitride film 50 is formed to a thickness of from 100 to 300 nm by plasma CVD, as shown in FIG. 8(A). In this case, the silicon nitride film 50 is formed under the conditions where the number of desorbed hydrogen molecules as measured by TDS is from $1 \times 10^{17}$ to $5 \times 10^{17}$ molecules/cm$^3$. Specifically, an example of the conditions is such that the flow rate of silane gas is from 200 to 400 sccm, the flow rate of ammonia (NH$_3$) gas is from 300 to 2000 sccm, the flow rate of nitrogen (N$_2$) gas is from 5000 to 10000 sccm, RF power is from 1000 to 5000 W, substrate temperature is from 200 to 400° C., and pressure is from 500 to 3000 mTorr. After the formation of the silicon nitride film 50, the silicon nitride film 50 is annealed at processing temperature of 220° C. for a processing period of 40 minutes in order to cause hydrogen contained in the silicon nitride film 50 to spread into the semiconductor layer 20, such that first length L1 is about 1 μm. Further, on the silicon nitride film 50, an interlayer insulating film 60 is formed to a thickness of from 200 to 400 nm by plasma CVD using a silicon oxide. Note that the silicon nitride film 50 can be annealed at the same time as another thermal treatment process, such as annealing for forming pixel electrodes, and in such a case, the manufacturing process can be simplified.

A resist pattern (not shown) for forming contact holes 70 is formed by photolithography, and the interlayer insulating film 60 and the silicon nitride film 50 are etched using the resist pattern as a mask, as shown in FIG. 8(B). As a result, the contact holes 70 are formed so as to reach the surface of the semiconductor layer 20 on opposite sides with respect to the gate electrode 40. In the contact holes 70 and also on the interlayer insulating film 60, a titanium film and a copper film are sequentially formed by sputtering, thereby forming a metal film stack 81.

On the titanium film, a resist pattern (not shown) is formed by photolithography, and the metal film stack 81 is dry-etched in the order: the titanium film and then the copper film, using the resist pattern as a mask, as shown in FIG. 8(C). As a result, on the interlayer insulating film 60, a source electrode layer 80s and a drain electrode layer 80d are formed in ohmic contact with the source region 20s and the drain region 20d, respectively, via the contact holes 70. The source electrode layer 80s and the drain electrode layer 80d extend so as to be away from each other (in the right-left direction in FIG. 8(C)). In this manner, the TFT 100 according to the present embodiment is formed.

<1.5 Effects>

In the present embodiment, the inclination angle of the side surface of the gate insulating film 30 is controlled such that first length L1 from position P0 at the end of the gate insulating film 30 to position P1 at the end of each of the source region 20s and the drain region 20d is substantially equal to second length L2 from position P0 at the end of the gate insulating film 30 to position P2 at the end of the gate electrode 40. As a result, in the TFT 100 with the semiconductor layer 20 made of an oxide semiconductor, leakage current is reduced, and there is almost no overlap between the gate electrode 40 and the low-resistance regions, resulting in diminished parasitic capacitance. Specifically, the absolute value of the difference between first length L1 and second length L2 is 0.5 µm. More preferably, overlap length D between the gate electrode 40 and each of the source region 20s and the drain region 20d is from 0 to 0.5 µm. Thus, parasitic capacitance can be diminished without reducing on-state current.

Furthermore, in the manufacturing process of the TFT 100, the inclination angle of the side surface of the gate insulating film 30 is obtained such that second length L2 is approximately equal to first length L1 determined by thermal treatment performed after the formation of the silicon nitride film 50, and the gate insulating film 30 is formed using an optimal processing condition selected from among a plurality of predetermined processing conditions under which the inclination angle of the side surface of the gate insulating film 30 is realized. As a result, overlap length D between the gate electrode 40 and the low-resistance region can be set at a desired value, resulting in diminished parasitic capacitance. Further, as another selectable processing condition, the post-bake setting temperature is selected in order to change the inclination angle of the edge of the resist pattern 42 serving as an etching mask in forming the gate electrode 40 and the gate insulating film 30. Thus, the inclination angle of the side surface of the gate insulating film 30 can be readily controlled.

2. Second Embodiment

Figure 9:
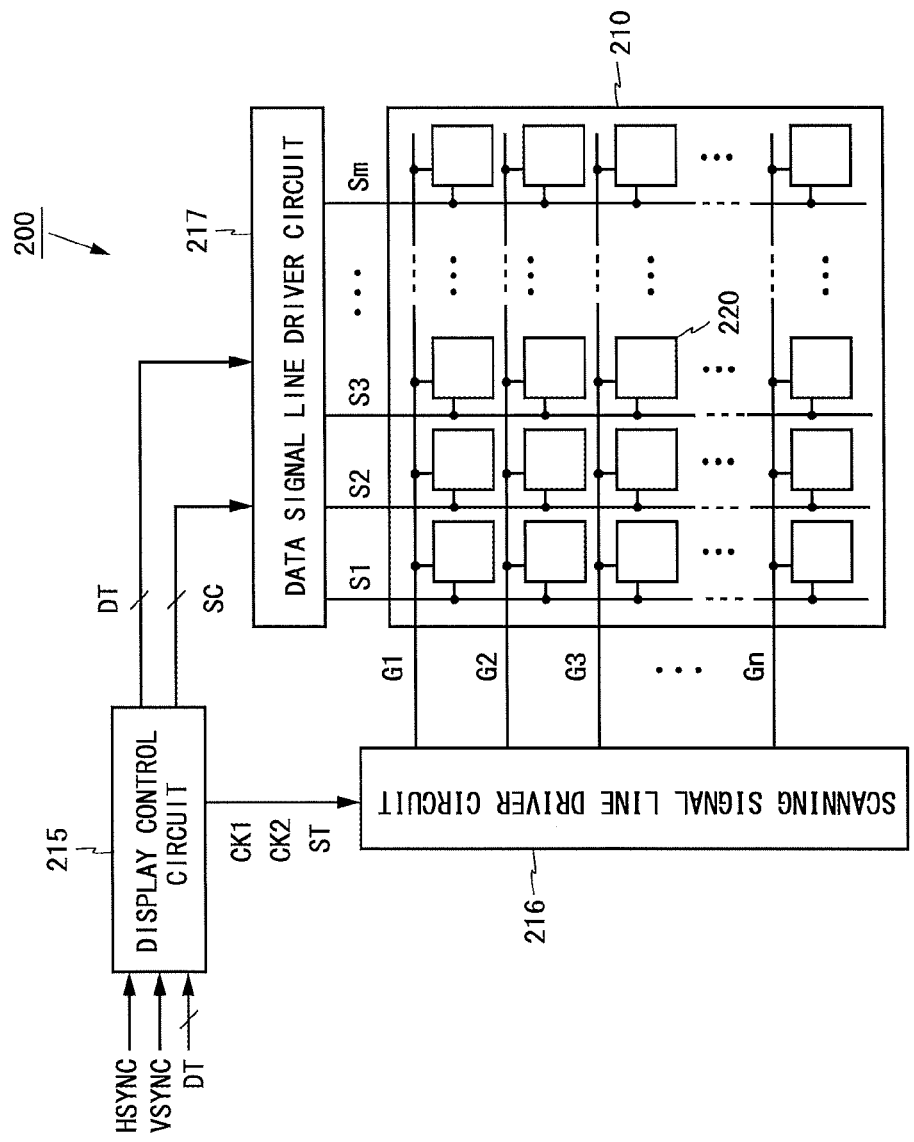
FIG. 9 is a block diagram illustrating the configuration of a liquid crystal display device according to a second embodiment of the present invention.

A liquid crystal display device 200 according to a second embodiment of the present invention will be described. FIG. 9 is a block diagram illustrating the configuration of the liquid crystal display device 200. The liquid crystal display device 200 is an active-matrix display device including a display portion 210, a display control circuit 215, a scanning signal line driver circuit 216, and a data signal line driver circuit 217, as shown in FIG. 9.

The display portion 210 includes n scanning signal lines $G_1$ to $G_n$, m data signal lines $S_1$ to $S_m$, and (m×n) pixel formation portions 220 (where m and n are integers of 2 or more, i is an integer of from 1 to n, and j is an integer of from 1 to m). The scanning signal lines $G_1$ to $G_n$ are arranged parallel to one another, and the data signal lines $S_1$ to $S_m$ are arranged parallel to one another so as to be perpendicular to the scanning signal lines $G_1$ to $G_n$. The pixel formation portion 220 is disposed in the vicinity of the intersection of the scanning signal line $G_i$ and the data signal line $S_j$. In this manner, the (m×n) pixel formation portions 220 are arranged two-dimensionally with each row consisting of n pixel formation portions and each column consisting of m pixel formation portions. The scanning signal line G is connected commonly to the pixel formation portions 220 disposed in the i'th row, and the data signal line $S_j$ is connected commonly to the pixel formation portions 220 disposed in the j'th column.

The liquid crystal display device 200 is externally supplied with control signals, such as a horizontal synchronization signal HSYNC and a vertical synchronization signal VSYNC, along with display data DT. In accordance with these signals, the display control circuit 215 outputs clock signals CK1 and CK2 and a start pulse ST to the scanning signal line driver circuit 216 and a control signal SC and the display data DT to the data signal line driver circuit 217.

The scanning signal line driver circuit 216 sequentially selects the scanning signal lines G1 to Gn one at a time, such that all pixel formation portions 220 for one row are selected at a time. The data signal line driver circuit 217 provides the data signal lines $S_1$ to $S_m$ with a voltage corresponding to the display data DT in accordance with the control signal SC and the display data DT. As a result, the voltage corresponding to the display data DT is written to the selected pixel formation portions 220 for the row. As a result, the liquid crystal display device 200 displays an image on the display portion 210.

<2.1 Structure of the Liquid Crystal Panel>

Figure 10:
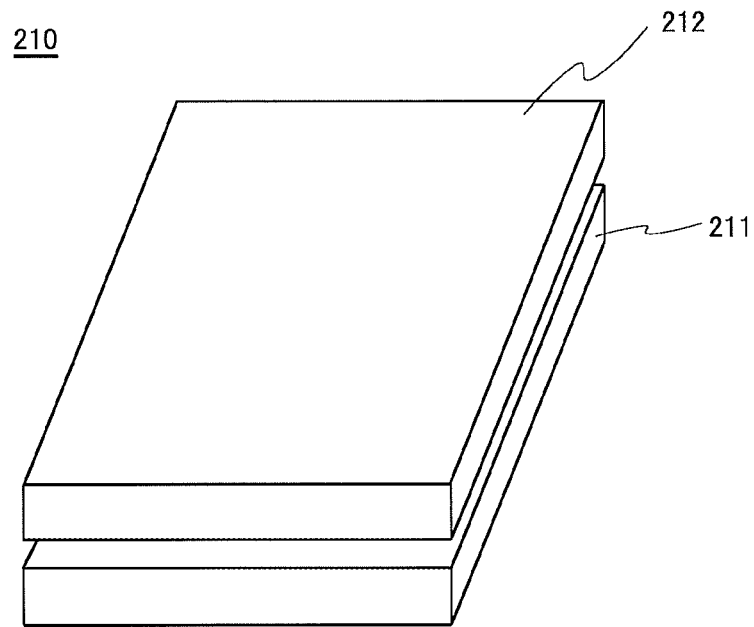
FIG. 10 is an oblique view illustrating the structure of a display portion of the liquid crystal display device shown in FIG. 9.

FIG. 10 is an oblique view illustrating the structure of the display portion 210 of the liquid crystal display device 200 shown in FIG. 9. As shown in FIG. 10, the display portion 210 includes two substrates 211 and 212 arranged so as to face each other with liquid crystals (not shown) sandwiched therebetween. The substrates 211 and 212 are sealed therearound by a sealant (not shown) so as to keep the liquid crystals from leaking. As for the two substrates 211 and 212, the substrate 211 is an active-matrix substrate having formed thereon the pixel formation portions 220, wiring for driving the pixel formation portions 220, etc., and the substrate 212 is a color-filter substrate with color filters and other elements formed thereon.

Figure 11:
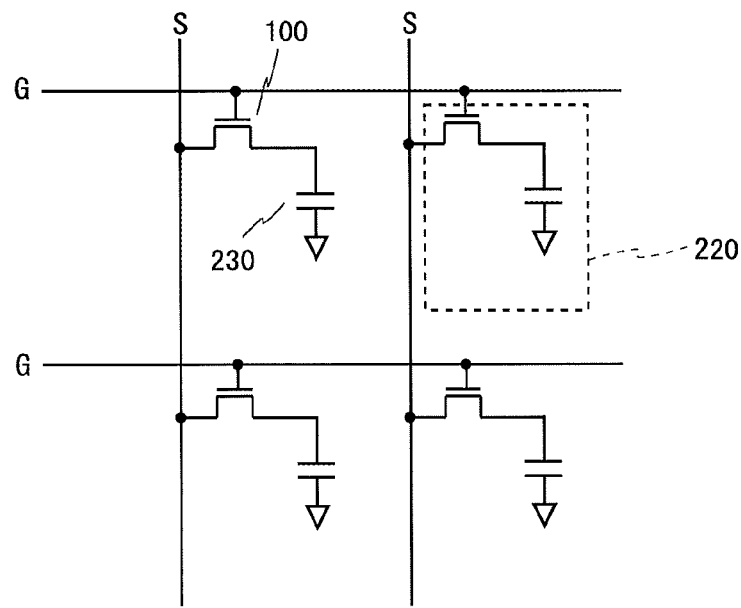
FIG. 11 is a diagram illustrating the configuration of a pixel formation portion formed on an active-matrix substrate included in the display portion of the liquid crystal display device shown in FIG. 9.

FIG. 11 is a diagram illustrating the configuration of the pixel formation portion 220 formed on the active-matrix substrate 211 included in the display portion 210 shown in FIG. 10. As shown in FIG. 11, each pixel formation portion 220 includes a TFT 100 and a pixel capacitor 230 connected to a drain electrode layer 80d of the TFT 100. The TFT 100 has the same structure as that described in the first embodiment shown in FIG. 1. When a high-level signal is applied to the scanning signal line G, the TFT 100 is rendered in ON state, so that an image signal provided to the data signal line S is written and held in the pixel capacitor 230. As a result, the pixel formation portion 220 displays an image corresponding to the image signal held in the pixel capacitor 230.

Figure 12:
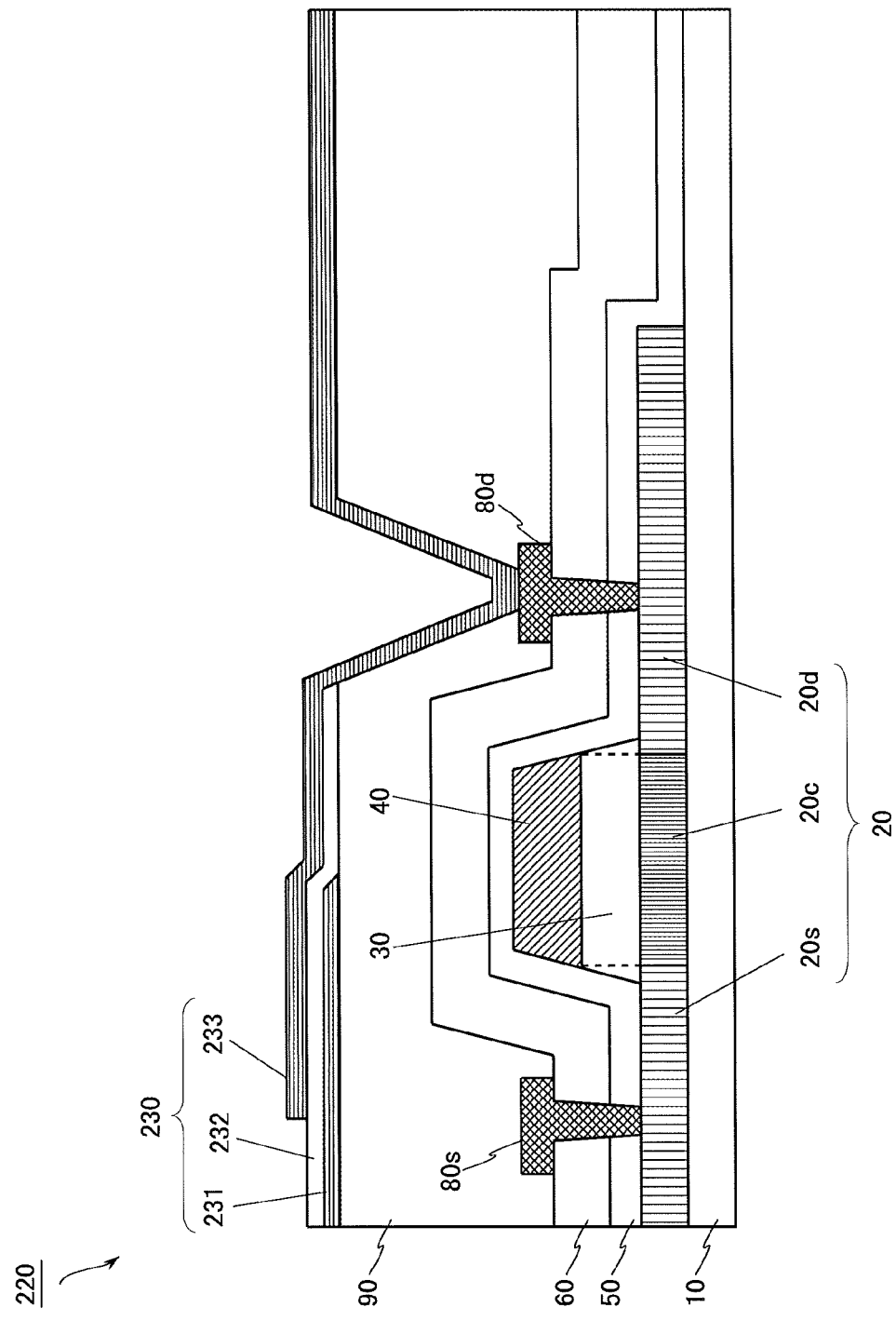
FIG. 12 is a cross-sectional view illustrating in cross section the pixel formation portion formed on the active-matrix substrate of the liquid crystal display device shown in FIG. 9.

FIG. 12 is a cross-sectional view illustrating in cross section the pixel formation portion 220 formed on the active-matrix substrate 211 of the liquid crystal display device 200 according to the present embodiment. The TFT included in the pixel formation portion 220 shown in FIG. 12 has the same structure as the TFT 100 described in the first embodiment shown in FIG. 1, therefore, each element is denoted by the same reference character as that in FIG. 1, and any description thereof will be omitted. The TFT includes a photosensitive organic interlayer film 90 made of an acrylic organic material, which is formed on the source electrode layer 80*s*, the drain electrode layer 80*d*, and a portion of the interlayer insulating film 60 that is not covered by these layers, in order to provide a flat surface on which the pixel capacitor 230 can be formed readily. The organic interlayer film 90 is an insulating film formed to a thickness of from 1.5 to 3 μm, for example, by spin coating with an acrylic organic material, and therefore is patterned through exposure and development by photolithography. As a result, the organic interlayer film 90 is removed from the drain electrode layer 80*d*, thereby exposing the drain electrode layer 80*d*.

Formed on the organic interlayer film 90 are, in this order, a common electrode 231 with a thickness of from 50 to 150 nm, a pixel insulating film 232 with a thickness of from 50 to 250 nm, and a pixel electrode 233 with a thickness of from 50 to 250 nm. The common electrode 231 is formed by patterning through photolithography a transparent conductive film, which is formed by sputtering of indium tin oxide (ITO), indium zinc oxide (IZO), zinc oxide, or the like. The pixel insulating film 232 is formed by plasma CVD of silicon oxide or silicon nitride. The pixel electrode 233 is formed by patterning through photolithography a transparent conductive film, which is formed by sputtering of indium tin oxide (ITO), indium zinc oxide (IZO), zinc oxide, or the like. The pixel electrode 233 is electrically connected at one end to the portion of the drain electrode layer 80*d* that is exposed by removing the portion of the pixel insulating film 232 that covers the drain electrode layer 80*d* when the pixel insulating film 232 is patterned. Accordingly, when an image signal is provided through the data signal line S, the image signal is written to the pixel capacitor 230 via the TFT. In this manner, the active-matrix substrate 211 included in the liquid crystal display device 200 is manufactured.

<2.2 Effects>

In the liquid crystal display device 200 in which the TFT that has the semiconductor layer 20 made of an oxide semiconductor is used as the switching element of the pixel formation portion 220, idling drive is performed for intermittent drive. In this case, when there is a significant parasitic capacitance Cgd created between the gate electrode 40 and the drain region 20*d*, drawing effect of the parasitic capacitance Cgd caused by switching off the TFTs results in variations in potential by charge stored in the pixel capacitors 230. Such variations are perceived by the observer as uneven display and therefore result in reduced display quality. Accordingly, conventional design takes account of the ratio of the capacitance of the pixel capacitor 230 to the parasitic capacitance Cgd, hut with the advancement of high definition display, the pixel capacitor 230 has been downsized, which makes it difficult to adjust the ratio to the parasitic capacitance, resulting in less freedom of design.

However, in the case of the TFT 100 described in the first embodiment, there is substantially no overlap between the gate electrode 40 and the low-resistance regions of the semiconductor layer 20, and therefore, there is only a small parasitic capacitance Cgd. Accordingly, by using the TFT 100 as the switching element of the pixel formation portion 220, it is rendered possible to eliminate the need to take account of the ratio of the capacitance of the pixel capacitor 230 to the parasitic capacitance Cgd at the time of design, resulting in more freedom of design. Thus, it is possible to achieve a higher aperture ratio and a higher contrast ratio for the liquid crystal display device 200, and further, it is possible to improve display quality.

3. Third Embodiment

In a third embodiment of the present invention, the configurations of the liquid crystal display device 200 and the display portion 210 are the same as in the second embodiment, and therefore, any drawings and descriptions thereof will be omitted.

Figure 13:
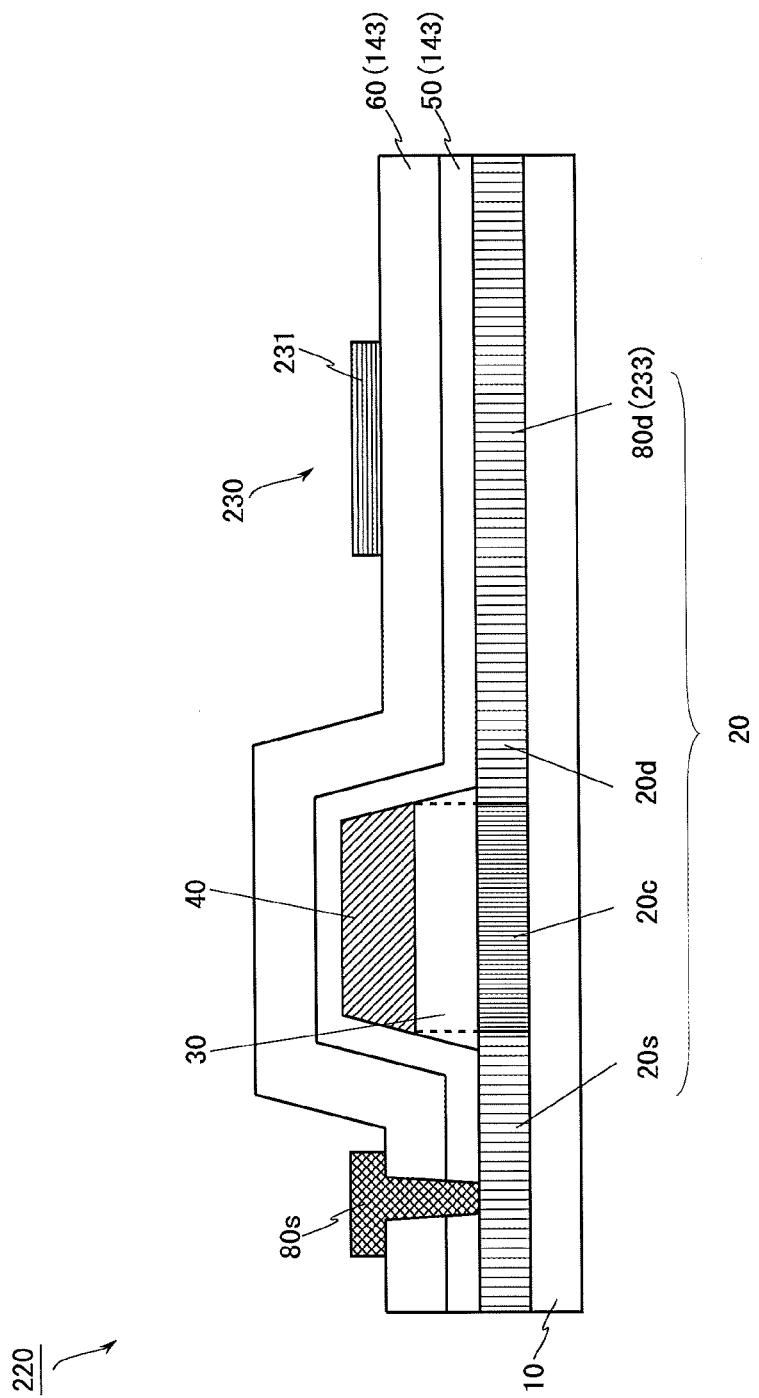
FIG. 13 is a cross-sectional view illustrating in cross section a pixel formation portion formed on an active-matrix substrate of a liquid crystal display device according to a third embodiment.
Figure 14:
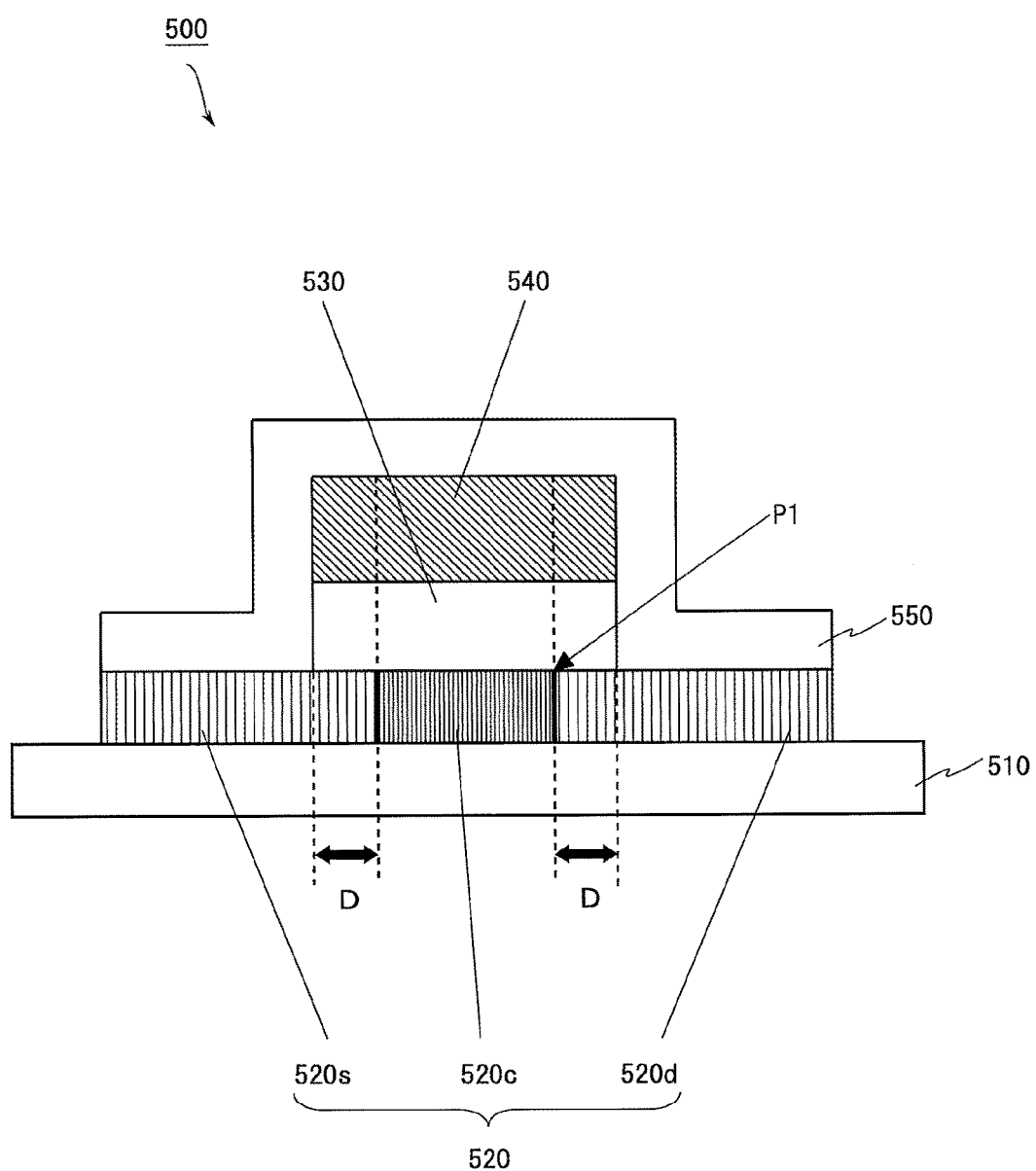
FIG. 14 is a cross-sectional view of a conventional TFT with a semiconductor layer in which low-resistance regions are formed.

FIG. 13 is a cross-sectional view illustrating in cross section the pixel formation portion 220 formed on the active-matrix substrate 211 of the liquid crystal display device 200 according to the present embodiment. As shown in FIG. 13, the pixel formation portion 220 includes a TFT and a pixel capacitor 230. The TFT included in the pixel formation portion 220 shown in FIG. 13 has the same structure as the TFT 100 described in the first embodiment shown in FIG. 1, except for the semiconductor layer 20, therefore, each element is denoted by the same reference character as in FIG. 1, and any description thereof will be omitted. The low-resistance region that is formed in the semiconductor layer 20 of the TFT and serves as the drain region 20*d* also functions as both a drain electrode layer 80*d* and a pixel electrode 233 for the pixel capacitor 230. Accordingly, the drain electrode layer 80*d* of the TFT and the pixel electrode 233 for the pixel capacitor 230 are electrically connected, and therefore, there is no need to additionally form a drain electrode layer 80*d* and a pixel electrode 233 of the pixel capacitor 230.

In the present embodiment, the pixel capacitor 230 includes a common electrode 231 formed on the interlayer insulating film 60 so as to be opposite the low-resistance region of the semiconductor layer 20 with the silicon nitride film 50 and the interlayer insulating film 60 positioned therebetween. As in the second embodiment, the common electrode 231 is a transparent conductive film formed to a thickness of from 5 to 150 nm by sputtering of a conductive oxide such as indium tin oxide (ITO), indium zinc oxide (120), or zinc oxide. Accordingly, when an image signal is provided via the data signal line S, the image signal charges the pixel capacitor 230 via the TFT 100 and is held therein. In this manner, the active-matrix substrate 211 included in the liquid crystal display device 200 is manufactured.

<3.1 Effects>

As with the second embodiment, the present embodiment renders it possible to increase the freedom of design, whereby it is possible to achieve a higher aperture ratio and a higher contrast ratio for the liquid crystal display device 200, and further, it is possible to improve display quality.

Furthermore, as for the liquid crystal display device 200 in the second embodiment, it is necessary to form the organic interlayer film 90, the pixel insulating film 232, and the pixel electrode 233, but the present embodiment renders it possible to eliminate the need to form such elements and use the semiconductor layer 20 in place of the elements. Thus, the present embodiment renders it possible to shorten the process for manufacturing the liquid crystal display device 200 and also reduce the manufacturing cost thereof.

INDUSTRIAL APPLICABILITY

The present invention is applied to semiconductor devices with a top-gate structure resistant to creation of parasitic capacitance and is also applied to display devices including such semiconductor devices and thereby being capable of high-speed drive and high-definition image display.

DESCRIPTION OF THE REFERENCE CHARACTERS

10 insulating substrate
20 semiconductor layer
20*s* source region (low-resistance region)

20d drain region (low-resistance region)
20c channel region
30 gate insulating film
41 metal film
42 resist pattern
40 gate electrode
50 silicon nitride film
55 hydrogen
60 interlayer insulating film
80s source electrode layer
80d drain electrode layer
100 TFT (semiconductor device)
200 liquid crystal display device
220 pixel formation portion
230 pixel capacitor
231 common electrode (first electrode)
232 pixel insulating film (insulating layer)
233 pixel electrode (second electrode)
P1 first position
P2 second position
L1 first length
L2 second length
D overlap length

What is claimed is:

1. A display device comprising:
a display portion including a plurality of scanning signal lines formed on an insulating substrate, a plurality of data signal lines crossing each of the scanning signal lines, and a plurality of pixel formation portions disposed in a matrix so as to correspond to intersections of the scanning signal lines and the data signal lines;
a scanning signal line driver circuit configured to sequentially activate and thereby select the scanning signal lines; and
a data signal line driver circuit configured to apply a voltage to the data signal lines in accordance with image data, wherein,
each of the pixel formation portions formed in the display portion includes:
  a semiconductor device comprising:
    a semiconductor layer formed on an insulating substrate;
    a gate insulating film having tapering side surfaces and formed on the semiconductor layer;
    a gate electrode having tapering side surfaces and formed on the gate insulating film;
    a source region and a drain region formed in the semiconductor layer on opposite sides with respect to the gate electrode;
    a silicon nitride film formed on the source region and the drain region of the semiconductor layer; and
    a source electrode layer and a drain electrode layer respectively in ohmic contact with the source region and the drain region, wherein,
    the source region and the drain region are low-resistance regions formed through reduction caused by hydrogen contained in the silicon nitride film, and
    the low-resistance region has a portion with a first length ranging from a first position on the semiconductor layer corresponding to an end of the gate insulating film to a region below the gate electrode, the first length being substantially equal to a second length ranging from the first position to a second position on the semiconductor layer corresponding to an end of the gate electrode; and
  a pixel capacitor configured to hold the image data provided via the data signal line by the semiconductor device being switched between on and off states, and
the pixel capacitor is formed above the semiconductor device and includes a first electrode connected to the data signal line via the semiconductor device, a second electrode disposed opposite the first electrode, and an insulating layer sandwiched between the first electrode and the second electrode.

2. A display device comprising:
a display portion including a plurality of scanning signal lines formed on an insulating substrate, a plurality of data signal lines crossing each of the scanning signal lines, and a plurality of pixel formation portions disposed in a matrix so as to correspond to intersections of the scanning signal lines and the data signal lines;
a scanning signal line driver circuit configured to sequentially activate and thereby select the scanning signal lines; and
a data signal line driver circuit configured to apply a voltage to the data signal lines in accordance with image data, wherein,
each of the pixel formation portions formed in the display portion includes:
  a semiconductor device comprising:
    a semiconductor layer formed on an insulating substrate;
    a gate insulating film having tapering side surfaces and formed on the semiconductor layer;
    a gate electrode having tapering side surfaces and formed on the gate insulating film;
    a source region and a drain region formed in the semiconductor layer on opposite sides with respect to the gate electrode;
    a silicon nitride film formed on the source region and the drain region of the semiconductor layer; and
    a source electrode layer and a drain electrode layer respectively in ohmic contact with the source region and the drain region, wherein,
    the source region and the drain region are low-resistance regions formed through reduction caused by hydrogen contained in the silicon nitride film, and
    the low-resistance region has a portion with a first length ranging from a first position on the semiconductor layer corresponding to an end of the gate insulating film to a region below the gate electrode, the first length being substantially equal to a second length ranging from the first position to a second position on the semiconductor layer corresponding to an end of the gate electrode; and
  a pixel capacitor configured to hold the image data provided via the data signal line by the semiconductor device being switched between on and off states, and
the pixel capacitor includes a first electrode connected to the data signal line via the semiconductor device, a second electrode disposed opposite the first electrode, and an insulating layer sandwiched between the first electrode and the second electrode, the first electrode being formed on the outside with respect to a drain region formed in the semiconductor layer of the semiconductor device, the second electrode being formed on an insulating film stacked above the semiconductor layer, so as to be opposite the first electrode.

\* \* \* \* \*